US011869951B2

(12) United States Patent
Hsu et al.

(10) Patent No.: US 11,869,951 B2
(45) Date of Patent: Jan. 9, 2024

(54) CONTROL GATE STRAP LAYOUT TO IMPROVE A WORD LINE ETCH PROCESS WINDOW

(71) Applicant: Taiwan Semiconductor Manufacturing Company, Ltd., Hsin-Chu (TW)

(72) Inventors: Yu-Ling Hsu, Tainan (TW); Ping-Cheng Li, Kaohsiung (TW); Hung-Ling Shih, Tainan (TW); Po-Wei Liu, Tainan (TW); Wen-Tuo Huang, Tainan (TW); Yong-Shiuan Tsair, Tainan (TW); Chia-Sheng Lin, Tainan (TW); Shih Kuang Yang, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 56 days.

(21) Appl. No.: 17/462,444

(22) Filed: Aug. 31, 2021

(65) Prior Publication Data

US 2021/0399103 A1 Dec. 23, 2021

Related U.S. Application Data

(62) Division of application No. 16/248,881, filed on Jan. 16, 2019, now Pat. No. 11,127,827.

(Continued)

(51) Int. Cl.

*H01L 29/423* (2006.01)
*H01L 23/528* (2006.01)

(Continued)

(52) U.S. Cl.

CPC .. *H01L 29/42328* (2013.01); *H01L 21/26513* (2013.01); *H01L 21/32139* (2013.01);

(Continued)

(58) Field of Classification Search

CPC ......... H01L 29/42328; H01L 27/11519; H10B 41/30; H10B 41/10

See application file for complete search history.

(56) References Cited

U.S. PATENT DOCUMENTS 6,541,324 B1 4/2003 Wang
2005/0012137 A1 1/2005 Levi et al.

(Continued)

OTHER PUBLICATIONS

Non-Final Office Action dated May 29, 2020 for U.S. Appl. No. 16/248,881.

(Continued)

*Primary Examiner* — Samuel A Gebremariam
*Assistant Examiner* — Jonas T Beardsley
(74) *Attorney, Agent, or Firm* — Eschweiler & Potashnik, LLC

(57) ABSTRACT

Various embodiments of the present application are directed towards a control gate layout to improve an etch process window for word lines. In some embodiments, an integrated chip comprises a memory array, an erase gate, a word line, and a control gate. The memory array comprises a plurality of cells in a plurality of rows and a plurality of columns. The erase gate and the word line are elongated in parallel along a row of the memory array. The control gate is elongated along the row and is between and borders the erase gate and the word line. Further, the control gate has a pad region protruding towards the erase gate and the word line. Because the pad region protrudes towards the erase gate and the word line, a width of the pad region is spread between word-line and erase-gate sides of the control gate.

20 Claims, 15 Drawing Sheets

100A $W_p$ $P_1$ 104a $W_{wl}$ $W_{eg}$ 106a 102a 108a 110 S 110 108b 102b 106b

Y X

A $W_{eg}$ 104b $P_2$ 110

Related U.S. Application Data

(60) Provisional application No. 62/736,593, filed on Sep. 26, 2018.

(51) Int. Cl.

| | |
|---|---|
| ***H01L 23/522*** | (2006.01) |
| ***H01L 29/40*** | (2006.01) |
| ***H01L 21/265*** | (2006.01) |
| ***H01L 29/66*** | (2006.01) |
| ***H01L 29/788*** | (2006.01) |
| ***H01L 21/3213*** | (2006.01) |
| ***H01L 21/28*** | (2006.01) |

(52) U.S. Cl.

CPC ........ *H01L 23/528* (2013.01); *H01L 23/5226* (2013.01); *H01L 29/401* (2013.01); *H01L 29/40114* (2019.08); *H01L 29/66825* (2013.01); *H01L 29/7881* (2013.01)

(56) References Cited

U.S. PATENT DOCUMENTS

| | | | |
|---|---|---|---|
| 2005/0127428 A1 | 6/2005 | Mokhlesi et al. | |
| 2005/0285207 A1 | 12/2005 | Kim | |
| 2006/0028868 A1 | 2/2006 | Okazaki et al. | |
| 2006/0035435 A1 | 2/2006 | Yasui et al. | |
| 2007/0047309 A1 | 3/2007 | Satoh et al. | |
| 2011/0085348 A1 | 4/2011 | Dobson | |
| 2011/0095348 A1* | 4/2011 | Chakihara | H01L 29/66659 257/E29.345 |
| 2013/0126958 A1 | 5/2013 | Ghazavi et al. | |
| 2015/0087123 A1* | 3/2015 | Wu | H01L 27/11548 438/257 |
| 2015/0206894 A1 | 7/2015 | Chen et al. | |
| 2016/0028868 A1 | 1/2016 | Scholz et al. | |
| 2016/0056250 A1 | 2/2016 | Chuang et al. | |
| 2016/0204118 A1* | 7/2016 | Wu | H01L 21/31116 438/258 |
| 2017/0032971 A1 | 2/2017 | Pan et al. | |
| 2018/0233509 A1 | 8/2018 | Cai et al. | |
| 2018/0315765 A1* | 11/2018 | Lin | H01L 27/11521 |

OTHER PUBLICATIONS

Final Office Action dated Dec. 14, 2020 for U.S. Appl. No. 16/248,881.

Notice of Allowance dated May 13, 2021 for U.S. Appl. No. 16/248,881.

* cited by examiner

CONTROL GATE STRAP LAYOUT TO IMPROVE A WORD LINE ETCH PROCESS WINDOW

REFERENCE TO RELATED APPLICATIONS

This Application is a Divisional of U.S. application Ser. No. 16/248,881, filed on Jan. 16, 2019, which claims the benefit of U.S. Provisional Application No. 62/736,593, filed on Sep. 26, 2018. The contents of the above referenced applications are hereby incorporated by reference in their entirety.

BACKGROUND

Many modern electronic devices include flash memory. Flash memory is an electronic non-volatile computer storage medium that can be electrically erased and reprogrammed. To store information, flash memory includes an addressable array of memory cells, typically made from floating gate transistors. Common types of flash memory cells include stacked-gate flash memory cells and split-gate flash memory cells (e.g., a third generation SUPERFLASH (ESF3) memory cell). Split-gate flash memory cells have lower power consumption, higher injection efficiency, less susceptibility to short channel effects, and over erase immunity compared to stacked-gate flash memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
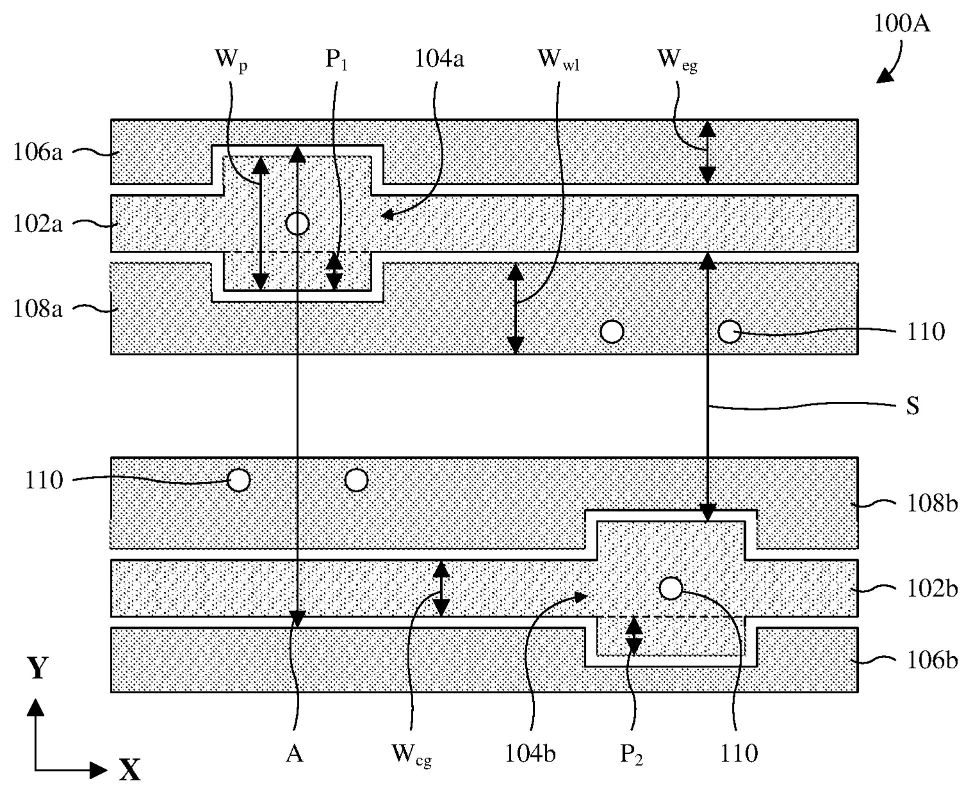
FIGS. 1A and 1B illustrate various views of some embodiments of an integrated chip comprising control gates with pad regions protruding on both word-line sides of the control gates and erase-gate sides of the control gates.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A memory array may, for example, comprise: a first control gate and a second control gate; a first word line and a second word line; and a source/drain region. The first and second word lines are between and respectively border the first and second control gates, and the source/drain region is between and borders the first and second word lines. The first and second control gates and the first and second word lines are elongated along respective rows of the memory array and span multiple columns of the memory array. Further, the first and second control gates respectively have a plurality of first pad regions and a plurality of second pad regions. The first pad regions protrude through the first word line from a single side of the first control gate, and the second pad regions protrude through the second word line from a single side of the second control gate. Further, the first pad regions are offset along the rows from the second pad regions. A challenge with the memory array is that spacing between the first and second control gates is small at the first and second pad regions. The small spacing, in turn, poses challenges while forming the first and second word lines.

While forming the first and second word lines, a conductive layer is formed lining the space between the first and second control gates and with an indent between the first and second control gates. Further, a hard mask layer is formed covering and lining the conductive layer. The hard mask layer is patterned with a layout of the first and second word lines and an etch is performed into the conductive layer with the hard mask layer in place. A challenge is the indent has a small width at the first and second pad regions due to the small spacing between the first and second control gates. As a result, the hard mask layer merges in the indent and hence has an increased thickness. The increased thickness prevents the layout from being accurately transferred to the hard mask layer and hence to the conductive layer, whereby a process window (e.g., resiliency) of the etch is decreased and a bulk manufacturing yield is decreased. For example, etch residue from the etch may define a leakage path between the first and second word lines. As another example, the first and second word lines may be formed with non-uniform widths (e.g., tapered widths) from top to bottom. The non-uniform widths may shift operating parameters of devices in the memory array and lead to device failure.

Various embodiments of the present application are directed towards a control gate layout to improve an etch process window for word lines. In some embodiments, an integrated chip comprises a memory array, an erase gate, a word line, and a control gate. The memory array comprises a plurality of cells in a plurality of rows and a plurality of columns, and the plurality of rows comprises a row. The erase gate and the word line are elongated in parallel along the row of the memory array. The control gate is elongated along the row and is between and borders the erase gate and the word line. Further, the control gate has a pad region protruding towards the erase gate and the word line.

Because the pad region protrudes towards the erase gate and the word line, a width of the pad region is spread amongst an erase-gate side of the control gate and a word-line side of the control gate. Because the width of the pad region is spread amongst the erase-gate side and the word-line side, the spacing between control gate and a neighboring control gate on the word-line side may be large at the pad region. Further, a hard mask merge may be avoided while forming the word line and other word lines. Because the hard mask merge may be avoided, bulk manufacturing yields may be increased. For example, the likelihood of etch residue defining leakage paths between neighboring word lines may be reduced and hence an etch process window (e.g., resiliency) for the word lines may be increased. As another example, sidewall profiles of the word lines may be vertical or substantially vertical. The vertical or substantially vertical sidewall profiles may, in turn, reduce the likelihood of shifts in operating parameters of devices in the memory array and reduce the likelihood of device failure.

With reference to FIG. 1A, a top layout 100A of some embodiments of an integrated chip comprising a first control gate 102*a* and a second control gate 102*b* is provided in which the first and second control gates 102*a* respectively have a first pad region 104*a* and a second pad region 104*b*. The first pad region 104*a* protrudes towards a first erase gate 106*a* from an erase-gate side of the first control gate 102*a*, and further protrudes towards a first word line 108*a* from a word-line side of the first control gate 102*a*. The second pad region 104*b* protrudes towards a second erase gate 106*b* from an erase-gate side of the second control gate 102*b*, and further protrudes towards a second word line 108*b* from a word-line side of the second control gate 102*b*.

The first and second control gates 102*a*, 102*b*, the first and second erase gates 106*a*, 106*b*, and the first and second word lines 108*a*, 108*b* are elongated in parallel in a first dimension (e.g., an X dimension), and the first and second pad regions 104*a*, 104*b* are offset from each other in the first dimension. Further, the first and second control gates 102*a*, 102*b*, the first and second erase gates 106*a*, 106*b*, and the first and second word lines 108*a*, 108*b* are spaced from each other in a second dimension (e.g., a Y dimension) transverse to the first dimension. The first and second control gates 102*a*, 102*b* are between and respectively border the first and second erase gates 106*a*, 106*b*, and the first and second word lines 108*a*, 108*b* are between and respectively border the first and second control gates 102*a*, 102*b*. The first and second control gates 102*a*, 102*b*, the first and second erase gates 106*a*, 106*b*, the first and second word lines 108*a*, 108*b*, or any combination of the foregoing may be or comprise, for example, doped polysilicon and/or some other suitable conductive material(s).

Because the first and second pad regions 104*a*, 104*b* protrude from both the erase-gate sides and the word-line sides, the first and second pad regions 104*a*, 104*b* have individual pad widths $W_p$ spread amongst the erase-gate sides and the word-line sides. Note that only one of the pad widths $W_p$ is labeled $W_p$. Because the pad widths $W_p$ are spread amongst the erase-gate sides and the word-line sides, a spacing S between the first and second control gates 102*a*, 102*b* is large at the first and second pad regions 104*a*, 104*b*. Because the spacing S is large, a hard mask merge is prevented while forming the first and second word lines 108*a*, 108*b*. For example, while forming the first and second word lines 108*a*, 108*b*, a conductive layer may be deposited lining the space between the first and second control gates 102*a*, 102*b* and with an indent between the first and second control gates 102*a*, 102*b*. Further, a hard mask layer may be deposited covering and lining the conductive layer. Because the spacing S is large, the indent may be large enough that the hard mask layer does not merge in the indent. Further, a thickness of the hard mask layer may be uniform or substantially uniform from the first control gate 102*a* to the second control gate 102*b*.

Because the hard mask merge is prevented, an etch to form the first and second word lines 108*a*, 108*b* may have a large process window (e.g., high resiliency). For example, continuing with the above example, a word-line pattern may be formed in the hard mask layer and the etch may be performed into the conductive layer with the hard mask layer in place. Because the hard mask merge is prevented, the word-line pattern may be accurately formed in the hard mask layer and accurately transferred from the hard mask layer to the conductive layer. As a result, the likelihood of etch residue defining leakage paths between the first and second word lines 108*a*, 108*b* is low and hence the process window (e.g., resiliency) of the etch is large. Further, bulk manufacturing yields are high.

In some embodiments, the spacing S is greater than about 0.30, 0.35, or 0.39 micrometers, between about 0.3-0.5 micrometers, between about 0.3-0.4 micrometers, between about 0.4-0.5 micrometers, or some other suitable value. If the spacing S is too small (e.g., less than about 0.3 micrometers or some other suitable value), the hard mask merge discussed above may occur. If the spacing is too large (e.g., greater than about 0.5 micrometers or some other suitable value), a separation between devices along the first control gate 102*a* and devices along the second control gate 102*b* will be large and chip area will be wasted.

The first and second pad regions 104*a*, 104*b* protrude towards the first and second word lines 108*a*, 108*b* by individual first amounts $P_1$ and protrude away from the first and second word lines 108*a*, 108*b* by individual second amounts $P_2$. Note that only one of the first amounts $P_1$ is labeled $P_1$ and only one of the second amounts $P_2$ is labeled $P_2$. In some embodiments, the first amounts $P_1$ are the same and/or the second amounts $P_2$ are the same. In some embodiments, the first amounts $P_1$ are different and/or the second amounts $P_2$ are different. In some embodiments, the first and second amounts $P_1$, $P_2$ for the first pad region 104*a* are the same and/or the first and second amounts $P_1$, $P_2$ for the second pad region 104*b* are the same. In some embodiments, the first and second amounts $P_1$, $P_2$ for the first pad region 104*a* are different and/or the first and second amounts $P_1$, $P_2$ for the second pad region 104*b* are different. In some embodiments, the first and second pad regions 104*a*, 104*b* are square, rectangular, circular, or some other suitable shape. In some embodiments, the first and second pad regions 104*a*, 104*b* are the same shape and/or size. In some embodiments, the first and second pad regions 104*a*, 104*b* have different shapes and/or sizes.

The first and second control gates 102*a*, 102*b* have individual control-gate widths $W_{cg}$ to sides of the first and second pad regions 104*a*, 104*b*. Note that only one of the control-gate widths $W_{cg}$ has been labeled $W_{cg}$. In some embodiments, the control-gate widths $W_{cg}$ are uniform or substantially uniform and/or the pad widths $W_p$ are uniform or substantially uniform. In some embodiments, the control-gate widths $W_{cg}$ are the same and/or the pad widths $W_p$ are the same. In some embodiments, the control-gate widths $W_{cg}$ are different and/or the pad widths $W_p$ are different. In some embodiments, the first and second control gates 102*a*, 102*b* are symmetrical about individual axes equally bisecting the control-gate widths $W_{cg}$ and along which the first and second control gates 102*a*, 102*b* are elongated. In other embodiments, the first control gate 102*a* is asymmetric about a respective one of the axes and/or the second control gate 102*b* is asymmetric about a respective one of the axes.

The first and second erase gates 106*a*, 106*b* have individual erase-gate widths $W_{eg}$ to sides of the first and second pad regions 104*a*, 104*b*, and the first and second word lines 108*a*, 108*b* have individual word-line widths $W_{wl}$ to sides of the first and second pad regions 104*a*, 104*b*. Note that only one of the erase-gate widths $W_{eg}$ has been labeled $W_{eg}$, and further note that only one of the word-line widths $W_{wl}$ has been labeled $W_{wl}$. In some embodiments, the erase-gate widths $W_{eg}$ and/or the word-line widths $W_{wl}$ are uniform or substantially uniform. In some embodiments, the word-line widths $W_{wl}$ are the same and/or the erase-gate widths $W_{eg}$ are the same. In some embodiments, the word-line widths $W_{wl}$ are different and/or the erase-gate widths $W_{eg}$ are different. In some embodiments, the first and second erase gates 106*a*, 106*b* are indented respectively at the first and second pad regions 104*a*, 104*b* and/or respectively conform to the first and second pad regions 104*a*, 104*b*. In some embodiments, the first and second word lines 108*a*, 108*b* are indented respectively at the first and second pad regions 104*a*, 104*b* and/or respectively conform to the first and second word lines 108*a*, 108*b*.

A plurality of contact vias 110 is on the first and second control gates 102*a*, 102*b* and the first and second word lines 108*a*, 108*b*. Note that only some of the contact vias 110 are labeled 110. The contact vias 110 are conductive and may, for example, be or comprise tungsten or some other suitable conductive material. In some embodiments, the contact vias 110 electrically couple the first and second control gates 102*a*, 102*b* to individual control-gate strap lines (not shown) and/or electrically couple the first and second word lines 108*a*, 108*b* to individual word-line strap lines (not shown). Hence, the first control gate 102*a* and/or the first word line 108*a* may, for example, correspond to a first strap cell, whereas the second control gate 102*b* and/or the second word line 108*b* may, for example, correspond to a second strap cell.

The control-gate and word-line strap lines are elongated in parallel with the first and second control gates 102*a*, 102*b* and the first and second word lines 108*a*, 108*b*. Further, the control-gate strap lines are or comprise a material with a lower resistance than that of the first and second control gates 102*a*, 102*b*, and the word-line strap lines are or comprise a material with a lower resistance than that of the first and second word lines 108*a*, 108*b*. In some embodiments, the first and second control gates 102*a*, 102*b* and/or the first and second word lines 108*a*, 108*b* are or comprise doped polysilicon, whereas the control-gate strap lines and/or the word-line strap lines are or comprise metal. Other materials are, however, amenable. By electrically coupling the control-gate and word-line strap lines respectively to the first and second control gates 102*a*, 102*b* and the first and second word lines 108*a*, 108*b*, voltage drops along the first and second control gates 102*a*, 102*b* and the first and second word lines 108*a*, 108*b* are reduced due to the lower resistances.

Figure 1B:
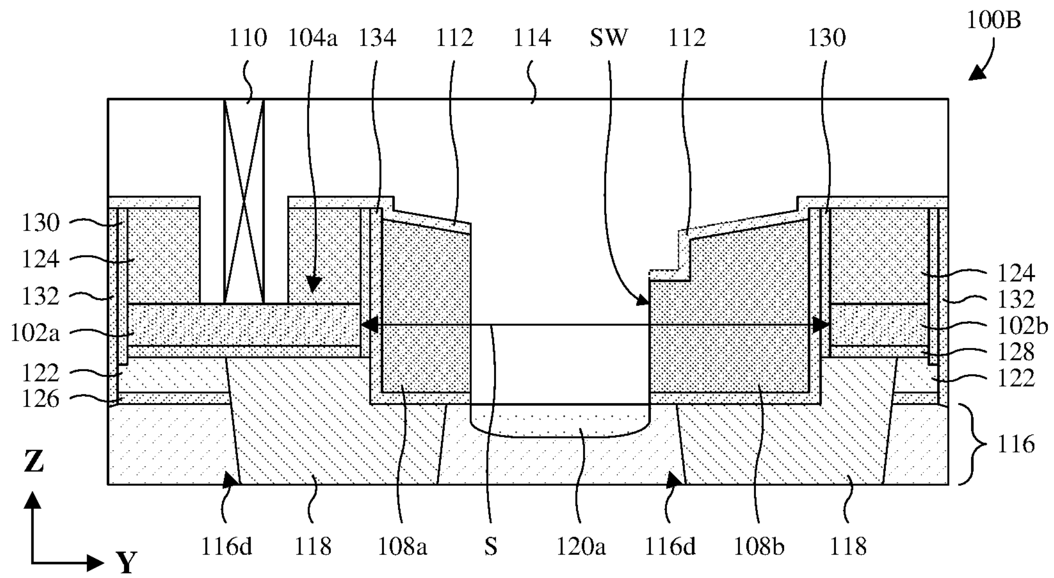

With reference to FIG. 1B, a cross-sectional view 100B of some embodiments of the integrated chip of FIG. 1A is provided. The cross-sectional view 100B may, for example, be taken along line A in FIG. 1A. The first and second control gates 102*a*, 102*b* and the first and second word lines 108*a*, 108*b* are covered by a word-line hard mask layer 112 and an interconnect dielectric layer 114. The word-line hard mask layer 112 may be or comprise, for example, silicon oxide and/or some other suitable dielectric(s), and/or the interconnect dielectric layer 114 may be or comprise, for example, a low k dielectric and/or some other suitable dielectric(s). Additionally, the first and second control gates 102*a*, 102*b* and the first and second word lines 108*a*, 108*b* overlie a substrate 116 and an isolation structure 118.

The isolation structure 118 protrudes into a top of the substrate 116 to demarcate a device region 116*d* of the substrate 116, and a source/drain region 120*a* is in device region 116*d* between the first and second word lines 108*a*, 108*b*. The device region 116*d* may, for example, have a top layout that is the negative of a top layout of the isolation structure 118, whereby the device region 116*d* may, for example, correspond to top portions of the substrate 116 to sides of the isolation structure 118. The isolation structure 118 may, for example, be or comprise silicon oxide and/or some other suitable dielectric(s) and/or may be or comprise, for example, a shallow trench isolation (STI) structure or some other suitable isolation structure. The substrate 116 may, for example, be a bulk silicon substrate or some other semiconductor substrate.

As noted above, the spacing S between the first and second control gates 102*a*, 102*b* is large at the first and second pad regions 104*a*, 104*b*. Note that the second pad region 104*b* is not shown in FIG. 1B but may be seen in FIG. 1A. Because the spacing S is large, a hard mask merge is prevented in the word-line hard mask layer 112 while forming the first and second word lines 108*a*, 108*b*. Because the hard mask merge is prevented, a word-line pattern may be accurately formed in the word-line hard mask layer 112. Further, the word-line pattern may be accurately transferred from the word-line hard mask layer 112 to a conductive layer by etching to form the first and second word lines 108*a*, 108*b*. As a result, the first and second word lines 108*a*, 108*b* may have substantially vertical sidewall profiles SW at the source/drain region 120*a*. The substantially vertical sidewall profiles SW may increase uniformity along and/or between the first and second word line 108*a*, 108*b* and may further increase the uniformity of operating parameters for devices defined in part by the first and second word lines 108*a*, 108*b*. The increased uniformity of operating parameters may reduce the likelihood that the devices will fail and may therefore increase bulk manufacturing yields.

The first and second control gates 102*a*, 102*b* also overlie individual floating gates 122 and are also covered by individual control-gate hard masks 124. The floating gates 122 are spaced from the substrate 116 by individual floating-gate dielectric layers 126 and are spaced from the first and second control gates 102*a*, 102*b* by individual control-gate dielectric layers 128. Note that only one of the floating-gate dielectric layers 126 is labeled 126 and only one of the control-gate dielectric layers 128 is labeled 128. The floating gates 122 may be or comprise, for example, doped polysilicon and/or some other suitable conductive material(s). The floating-gate dielectric layers 126 may be or comprise, for example, silicon oxide and/or some other suitable dielectric (s). The control-gate hard masks 124 and/or the control-gate dielectric layers 128 may be or comprise, for example, silicon oxide, silicon nitride, some other suitable dielectric (s), or any combination of the foregoing.

The first and second control gates 102*a*, 102*b* are lined by individual control-gate sidewall spacers 130. Further, the first and second erase gates 106*a*, 106*b* (not shown, see FIG. 1A) are lined by individual erase-gate dielectric layers 132, and the first and second word lines 108*a*, 108*b* are lined by individual word-line dielectric layers 134. Note that only one of the word-line dielectric layers 134 is labeled. The erase-gate dielectric layers 132 separate the first and second erase gates 106*a*, 106*b* from the floating gates 122, the control-gate sidewall spacers 130, and the substrate 116. The word-line dielectric layers 134 separate the first and second word lines 108*a*, 108*b* from the substrate 116, the isolation structure 118, and the control-gate sidewall spacers 130. The control-gate sidewall spacers 130 may be or comprise, for example, silicon oxide, silicon nitride, some other suitable dielectric(s), or any combination of the foregoing. The erase-gate dielectric layers 132 and/or the word-line dielectric layers 134 may be or comprise, for example, silicon oxide and/or some other suitable dielectric(s).

Figure 2:
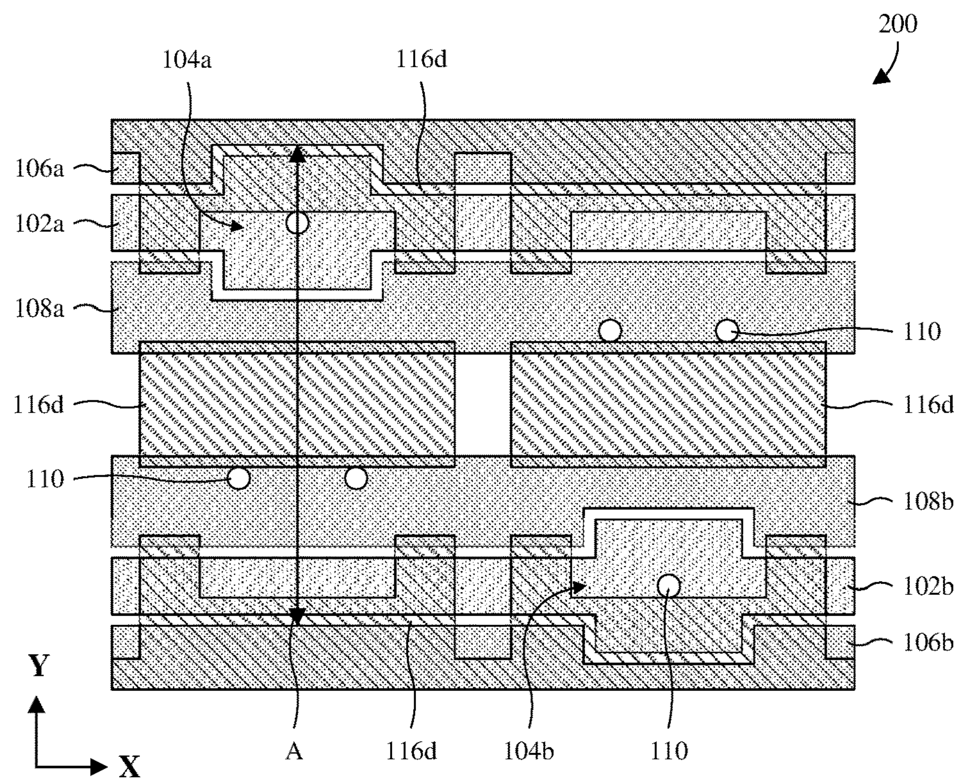
FIG. 2 illustrates a top layout of some embodiments of the integrated chip of FIGS. 1A and 1B in which a device region is shown.

With reference to FIG. 2, a more detailed top layout 200 of some embodiments of the integrated chip of FIG. 1A is provided in which the device region 116*d* is shown. The device region 116*d* is a region of a substrate that is active during operation of integrated chip. The device region 116*d* may, for example, be active in that the device region 116*d* undergoes depletion and/or enhancement during operation of the integrated chip and/or may, for example, be active in that current flows through the device region 116*d* during operation of the integrated chip. The device region 116*d* is demarcated by the isolation structure 118 (see FIG. 1B) and may, for example, have a layout that is the negative of a layout of the isolation structure 118. Hence, the isolation structure 118 may, for example, be everywhere or substantially everywhere the device region 116*d* is not.

Figure 3A:
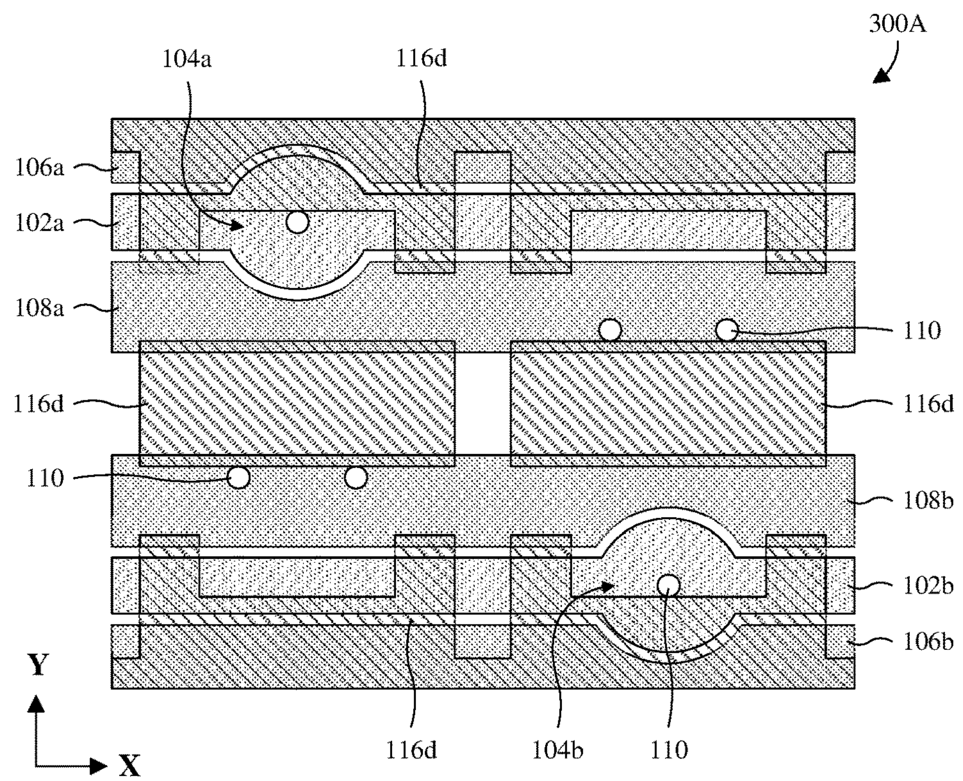
FIGS. 3A-3C illustrate top layouts of some alternative embodiments of the integrated chip of FIG. 2 in which the pad regions are varied.

With reference to FIG. 3A, a top layout 300A of some alternative embodiments of the integrated chip of FIG. 2 is provided in which the first and second pad regions 104*a*, 104*b* are circular. Other suitable shapes are, however, amenable.

Figure 3B:
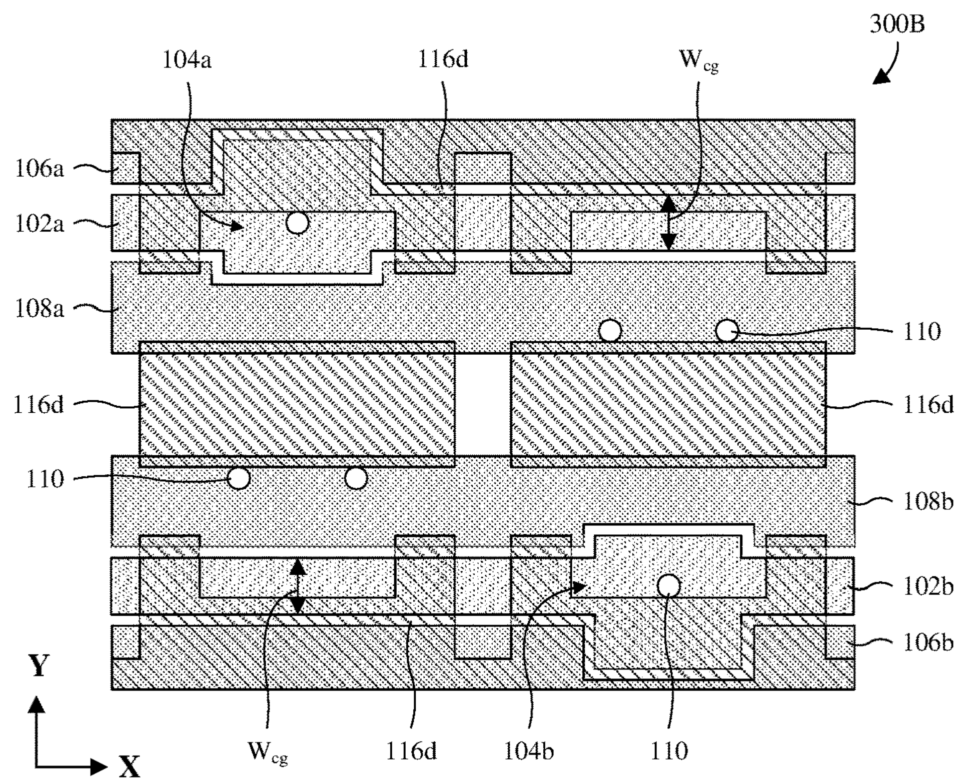

With reference to FIG. 3B, a top layout 300B of some alternative embodiments of the integrated chip of FIG. 2 is provided in which the first and second pad regions 104*a*, 104*b* protrude farther away from the first and second word lines 108*a*, 108*b* than towards the first and second word lines 108*a*, 108*b*. Accordingly, the first and second control gates 102*a*, 102*b* are asymmetric about individual axes equally bisecting the control-gate widths $W_{cg}$ and along which the first and second control gates 102*a*, 102*b* are elongated. In alternative embodiments, the first and second pad regions 104*a*, 104*b* may protrude farther towards the first and second word lines 108*a*, 108*b* than away from the first and second word lines 108*a*, 108*b*.

Figure 3C:
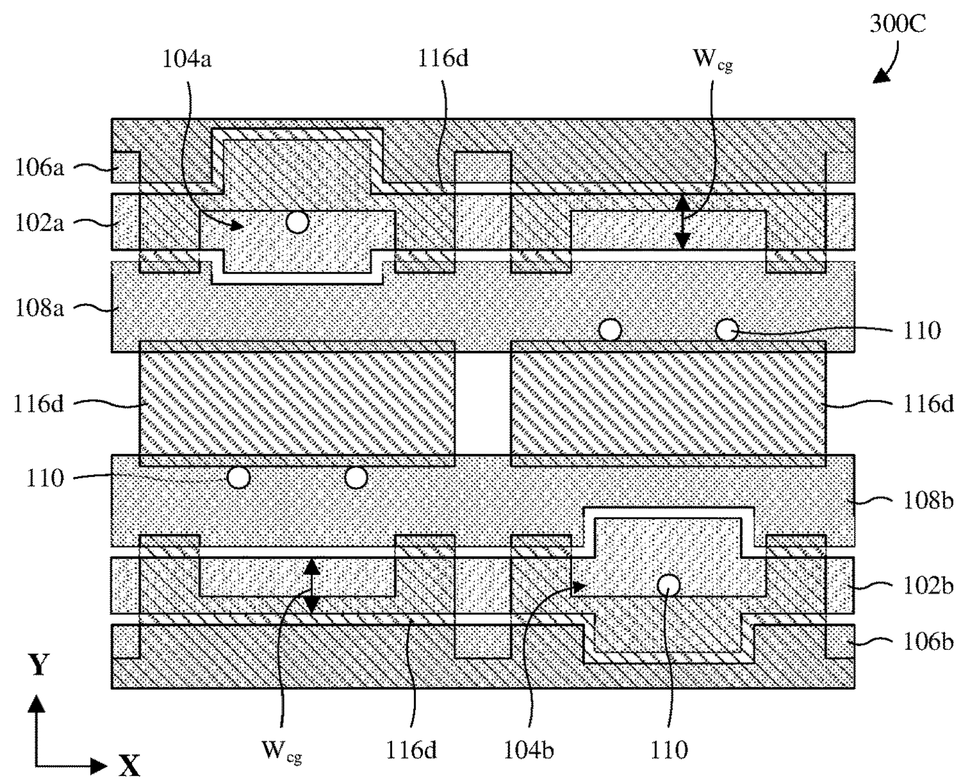

With reference to FIG. 3C, a top layout 300C of some alternative embodiments of the integrated chip of FIG. 2 is provided in which the first and second control gates 102*a*, 102*b* have different layouts at the first and second pad regions 104*a*, 104*b*. The first pad region 104 protrudes farther away from the first and second word lines 108*a*, 108*b* than towards the first and second word lines 108*a*, 108*b*, whereas the second pad region 104*b* protrudes away from and towards the first and second word lines 108*a*, 108*b* by the same amount. In some embodiments, the first pad region 104*a* is asymmetric about an axis equally bisecting the control-gate width $W_{cg}$ of the first control gate 102*a*, whereas the second pad region 104*b* is symmetric about an axis equally bisecting the control-gate width $W_{cg}$ of the second control gate 102*b*. In alternative embodiments, the first and second pad regions 104*a*, 104*b* may have different shapes, different sizes, different orientations, or any combination of the foregoing.

Figure 4A:
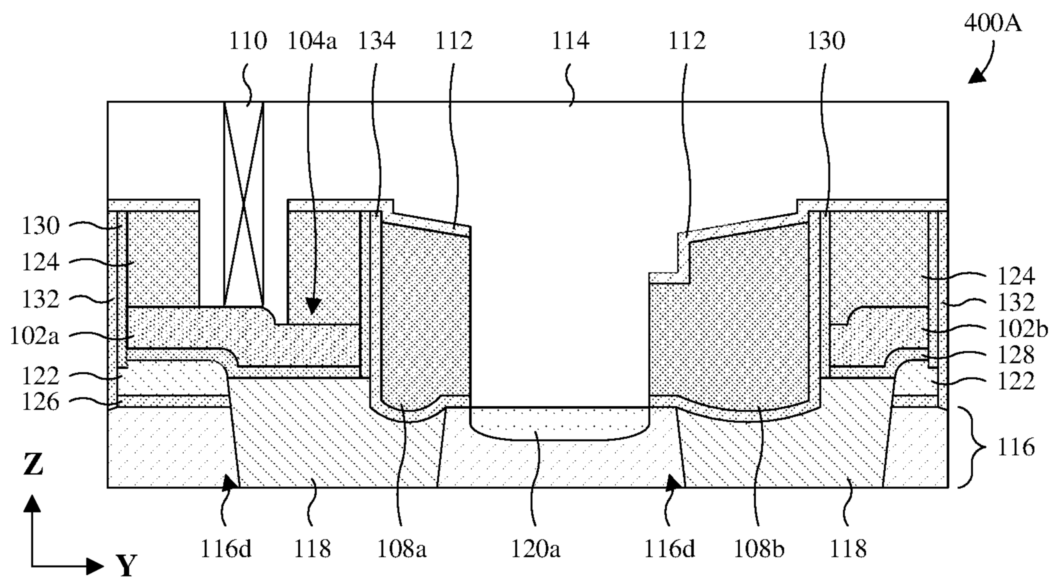
FIGS. 4A and 4B illustrate cross-sectional views of some alternative embodiments of the integrated chip of FIGS. 1A and 1B in which an isolation structure is varied.

With reference to FIG. 4A, a cross-sectional view 400A of some alternative embodiments of the integrated chip of FIG. 1B is provided in which a top surface of the isolation structure 118 is recessed below top surfaces of the floating gates 122. As a result, the first and second control gates 102*a*, 102*b* are recessed at the isolation structure 118. Additionally, portions of the isolation structure 118 underlying the first and second word lines 108*a*, 108*b* are recessed below a top surface of the substrate 116. As a result, the first and second word lines 108*a*, 108*b* protrude downward at these recessed portions of the isolation structure 118.

Figure 4B:
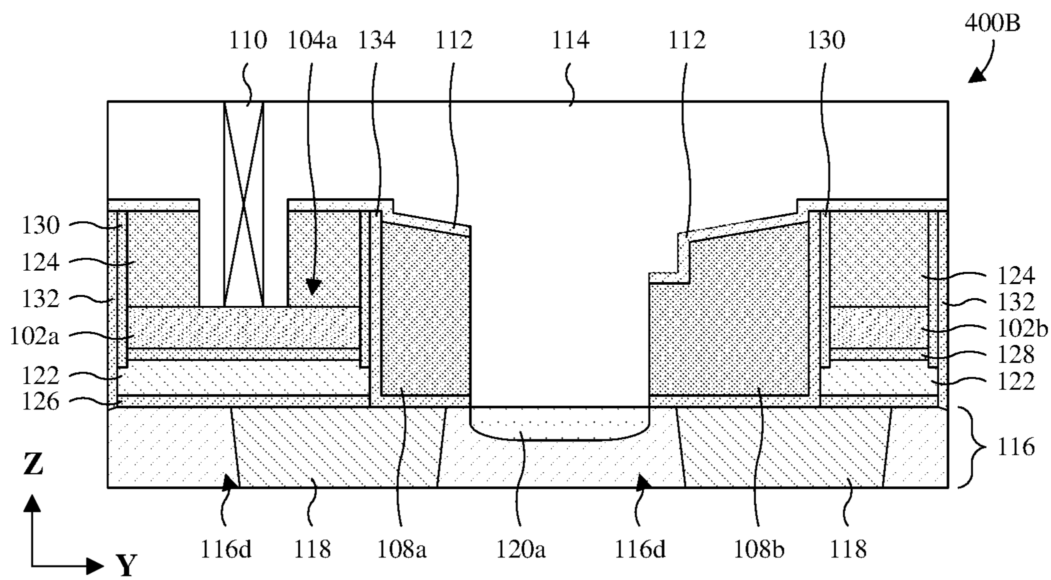

With reference to FIG. 4B, a cross-sectional view 400B of some alternative embodiments of the integrated chip of FIG. 1B is provided in which the floating gates 122 overlie the isolation structure 118.

Figure 5A:
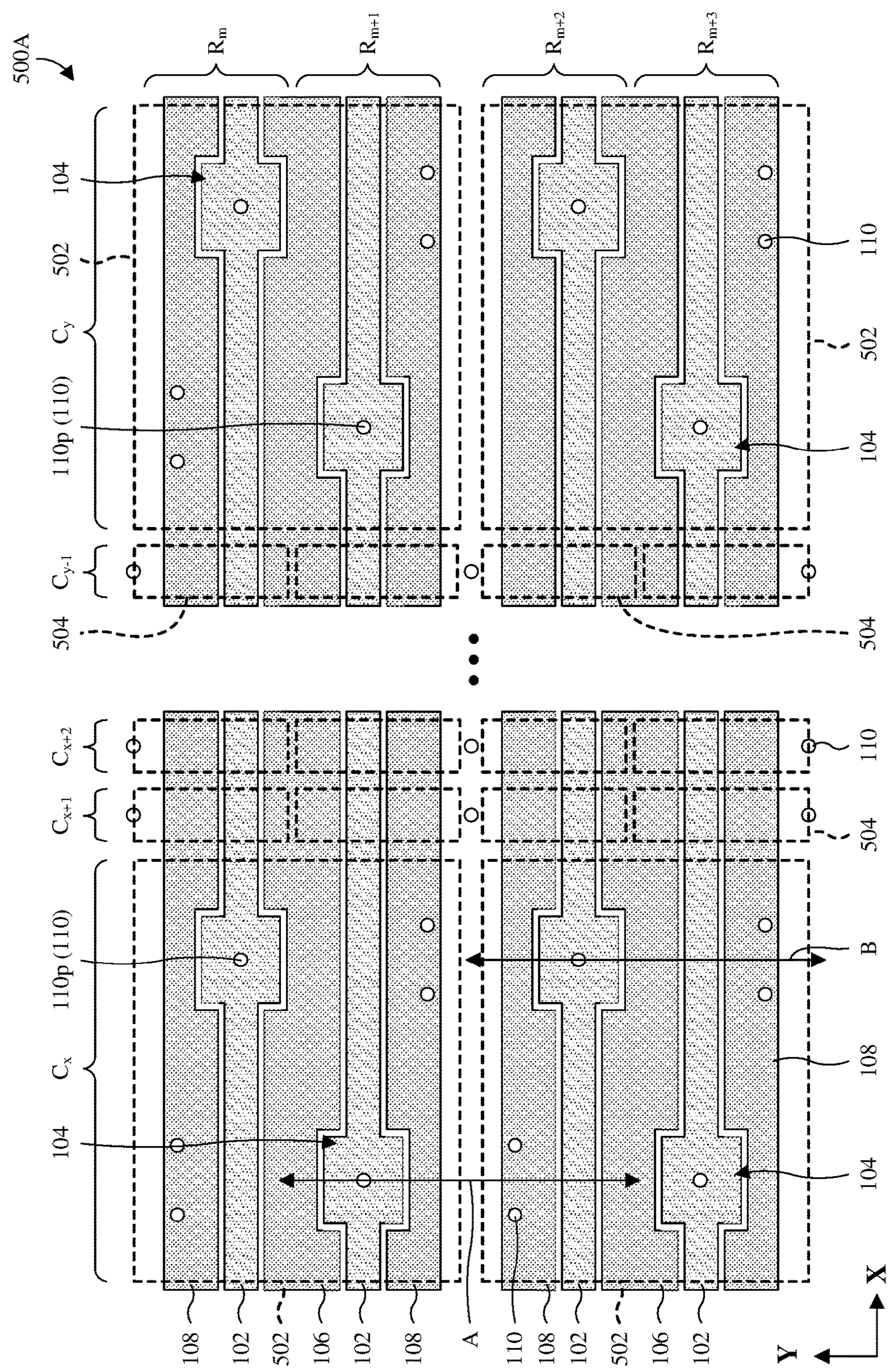
FIGS. 5A and 5B illustrate top layouts of some embodiments of an integrated chip comprising a memory array in which control gates have pad regions protruding on both word-line sides of the control gates and erase-gate sides of the control gates.

With reference to FIG. 5A, a top layout 500A of some embodiments of an integrated chip comprising a memory array is provided in which the memory array comprises control gates 102 having pad regions 104 protruding on both word-line sides of the control gates 102 and erase-gate sides of the control gates 102. Note that only some of the pad regions 104 are labeled 104. The memory array further comprises erase gates 106 and word lines 108 bordering the control gates 102.

The control gates 102, the erase gates 106, and the word lines 108 partially define a plurality of strap cells 502 and a plurality of memory cells 504. Note that only some of the memory cells 504 are labeled 504. The strap cells 502 and the memory cells 504 are in a plurality of rows and a plurality of columns, and the strap cells 502 each span two rows. For clarity, the rows are respectively labeled $R_m$, $R_{m+1}$, $R_{m+2}$, and $R_{m+3}$ and the columns are respectively labeled $C_x$, $C_{x+1}$, $C_{x+2}$, $C_{y-1}$, and $C_y$. The subscripts of the row labels identify corresponding row numbers, and the subscripts of the column labels identify corresponding column numbers. m is an integer representing a row number in the memory array, and x and y are integers representing column numbers in the memory array.

The control gates 102, the erase gates 106, and the word lines 108 are elongated along the rows (e.g., $R_m$ to $R_{m+3}$) and are spaced from each other along the columns (e.g., $C_x$, to $C_y$). Further, the pad regions 104 repeat along the control gates 102 at the strap cells 502. In some embodiments, the pad regions 104 in rows $R_m$ and $R_{m+2}$ are each as the second pad region 104*b* in FIGS. 1A and 1B is illustrated and described, and/or the pad regions in rows $R_{m+1}$ and $R_{m+3}$ are each as the first pad region 104*a* in FIGS. 1A and 1B is illustrated and described. In alternative embodiments, the pad regions 104 in rows $R_m$ and $R_{m+2}$ are each as the second pad region 104*b* in any one of FIGS. 3A-3C is illustrated and described, and/or the pad regions in rows $R_{m+1}$, and $R_{m+3}$ are each as the first pad region 104*a* in any one of FIGS. 3A-3C, 4A, and 4B is illustrated and described. In some embodiments, a portion of the memory array at column $C_x$ and rows $R_{m+1}$, and $R_{m+2}$ is as illustrated and described by FIGS. 1A and 1B, and/or a portion of the memory array at column $C_y$ and rows $R_{m+1}$ and $R_{m+2}$ is as illustrated and described by FIGS. 1A and 1B. For example, FIG. 1B may be taken along line A. In alternative embodiments, a portion of the memory array at column $C_x$ and rows $R_{m+1}$ and $R_{m+2}$ is as illustrated and described by any one of FIGS. 2, 3A-3C, 4A, and 4B, and/or a portion of the memory array at column $C_y$ and rows $R_{m+1}$ and $R_{m+2}$ is as illustrated and described by any one of FIGS. 2, 3A-3C, 4A, and 4B. For example, any one of FIGS. 4A and 4B may be taken along line A.

A plurality of contact vias 110 is on the control gates 102 and the word lines 108 at the strap cells 502. Note that only some of the contact vias 110 are labeled, and further note that contact vias at the pad regions 104 may also be referred to as pad contact vias 110*p*. The contact vias 110 electrically couple the control gates 102 and the word lines 108 respectively to strap lines (not shown). The strap lines are elongated in parallel with the control gates 102 and the word lines 108 and have lower resistances than the control gates 102 and the word lines 108. By electrically coupling or "strapping" the strap lines to the control gates 102 and the word lines 108, voltage drops along the control gates 102 and the word line 108 are reduced and power efficiency is enhanced.

Figure 5B:
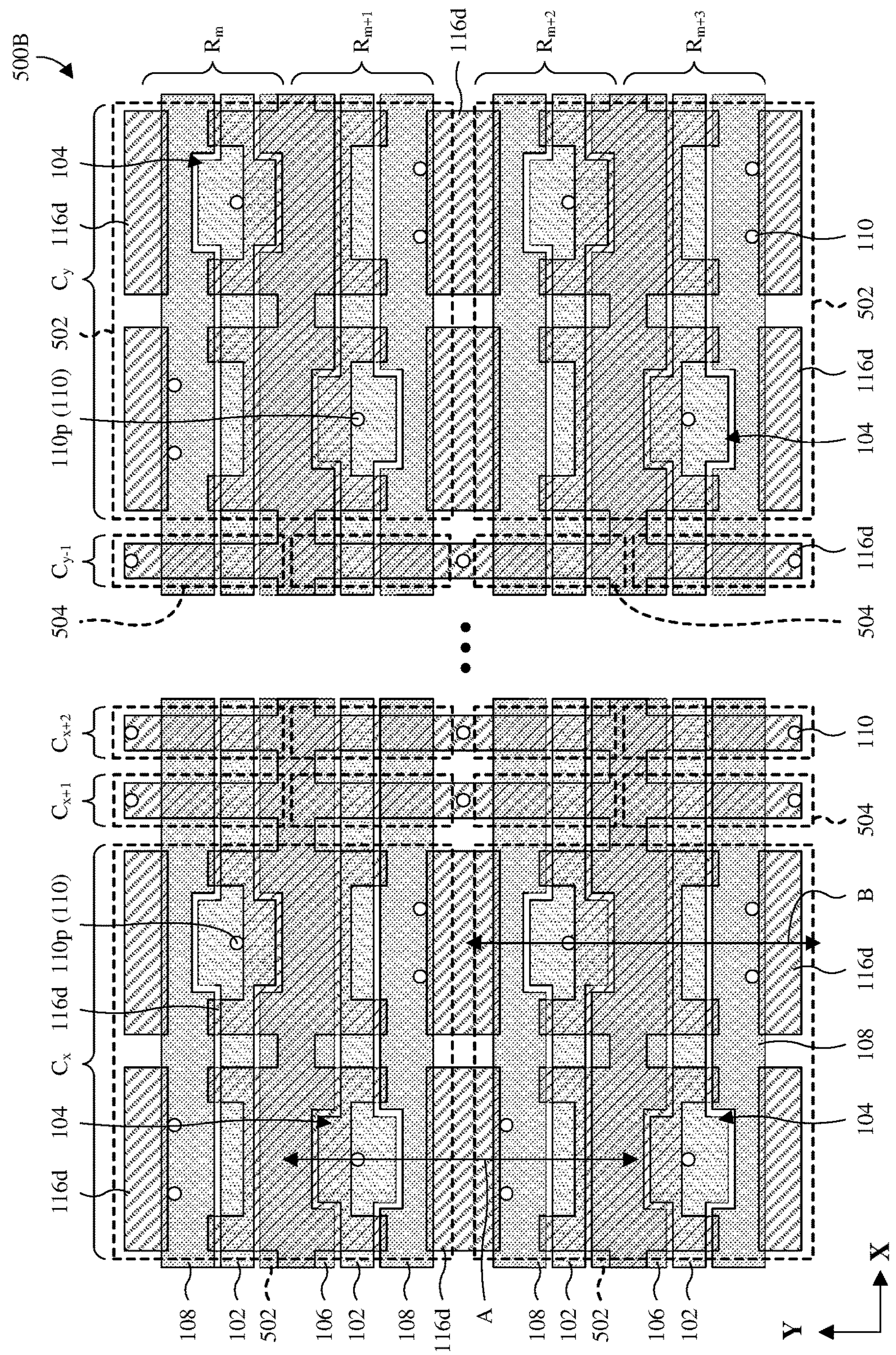

With reference to FIG. 5B, a more detailed top layout 500B of some embodiments of the integrated chip of FIG. 5A is provided in which a device region 116*d* is further shown. Note that only some segments of the device region 116*d* are labeled 116*d*. The device region 116*d* is a region of a substrate that is active during operation of integrated chip. As above, the device region 116*d* is demarcated by an isolation structure (not shown) and may, for example, have a layout that is the negative of a layout of the isolation structure.

Figure 6:
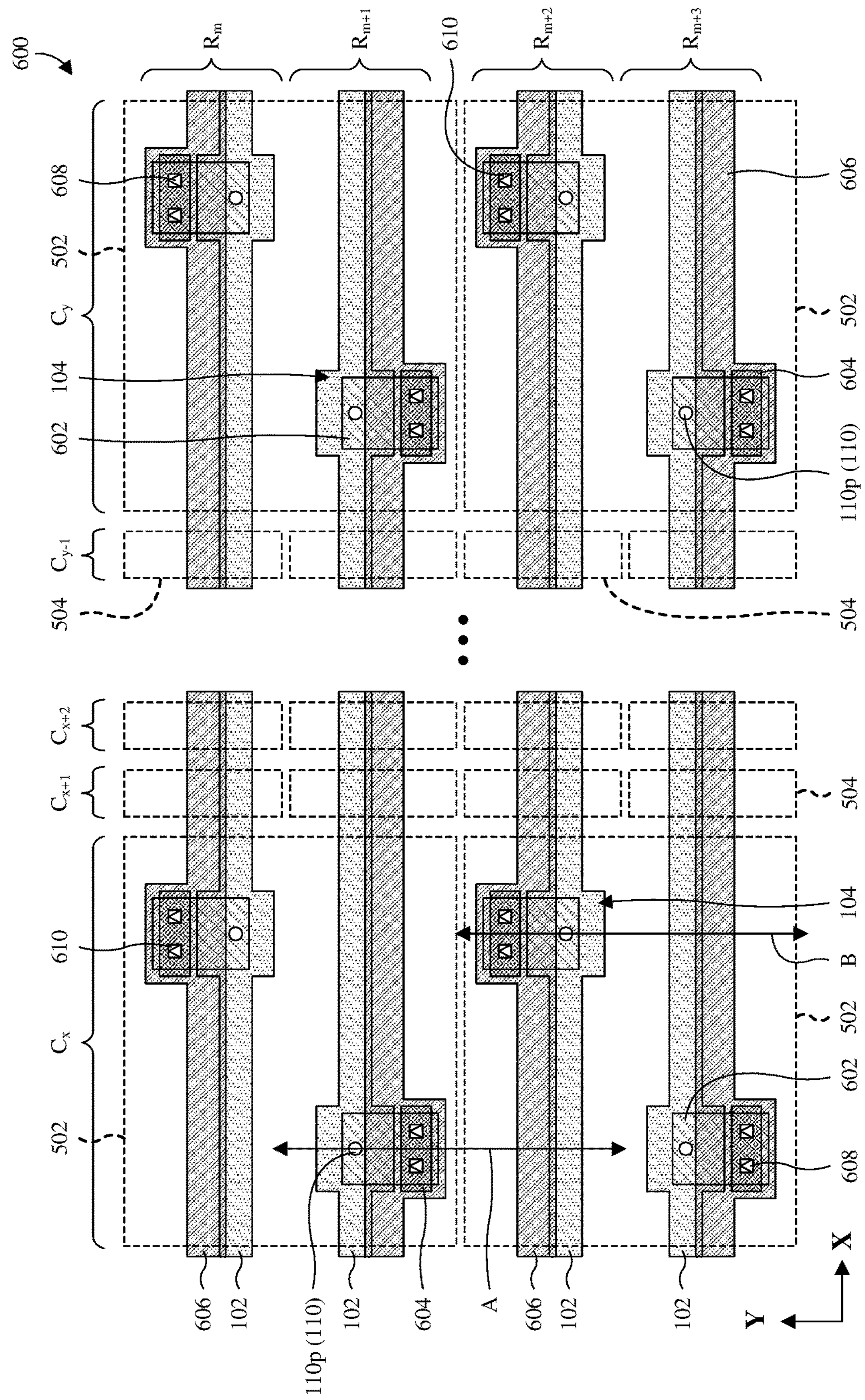
FIG. 6 illustrates a top layout of some embodiments of the integrated chip of FIGS. 5A and 5B in which a plurality of wires and a plurality of vias interconnect the pad regions.

With reference to FIG. 6, a top layout 600 of some embodiments of the integrated chip of FIGS. 5A and 5B is provided in which a plurality of wires (e.g., 602, 604, and 606) and a plurality of vias (e.g., 110*p*, 608, and 610) interconnect the pad regions 104 of the control gates 102. Note that only wires and vias interconnecting the pad regions 104 are shown, but additional wires and/or vias may be present in the integrated chip. The wires and/or the vias have resistances less than those of the control gates 102 and electrically couple each pad region to each other pad region in a corresponding row. By doing so, resistances and hence voltage drops along the control gates 102 are reduced, thereby enhancing power efficiency. In some embodiments, the wires and/or the vias are or comprise metal, whereas the control gates 102 are or comprise doped polysilicon. Other materials are, however, amenable.

The wires and the vias are grouped by elevation above a substrate (not shown) and each elevation is represented by a different hash (e.g., for wires) and/or shape (e.g., for vias). The plurality of wires comprises a plurality of first-level pad wires 602, a plurality of second-level pad wires 604, and a plurality of third-level pad wires 606. Note that only some of the first-level pad wires 602 are labeled, only some of the second-level pad wires 604 are labeled, and only some of the third-level pad wires 606 are labeled. Further, the plurality of vias comprises the plurality of pad contact vias 110*p* (also known as zero-level pad vias), a plurality of first-level pad vias 608, and a plurality of second-level pad vias 610. Note that only some of the pad contact vias 110*p* are labeled, only some of the first-level pad vias 608 are labeled, and only some of the second-level pad vias 610 are labeled. Further, note that the contact vias 110 at the pad regions 104 in FIGS. 5A and 5B correspond to the pad contact vias 110*p*.

The first-level pad wires 602 and the pad contact vias 110*p* are individual to the pad regions 104, and the pad contact vias 110*p* electrically couple the first-level pad wires 602 to the pad regions 104. The second-level pad wires 604 and the first-level pad vias 608 are individual to the pad regions 104, and the first-level pad vias 608 electrically couple the second-level pad wires 604 to the first-level pad wires 602. The third-level pad wires 606 are individual to the rows (e.g., $R_m$ to $R_{m+3}$) of the memory array and elongated along the rows. Further, the third-level pad wires 606 may also be known as control-gate strap lines (discussed above). The second-level pad vias 610 are individual to the pad regions 104 and electrically couple the third-level pad wires 606 to the second-level pad wires 604.

Figure 7:
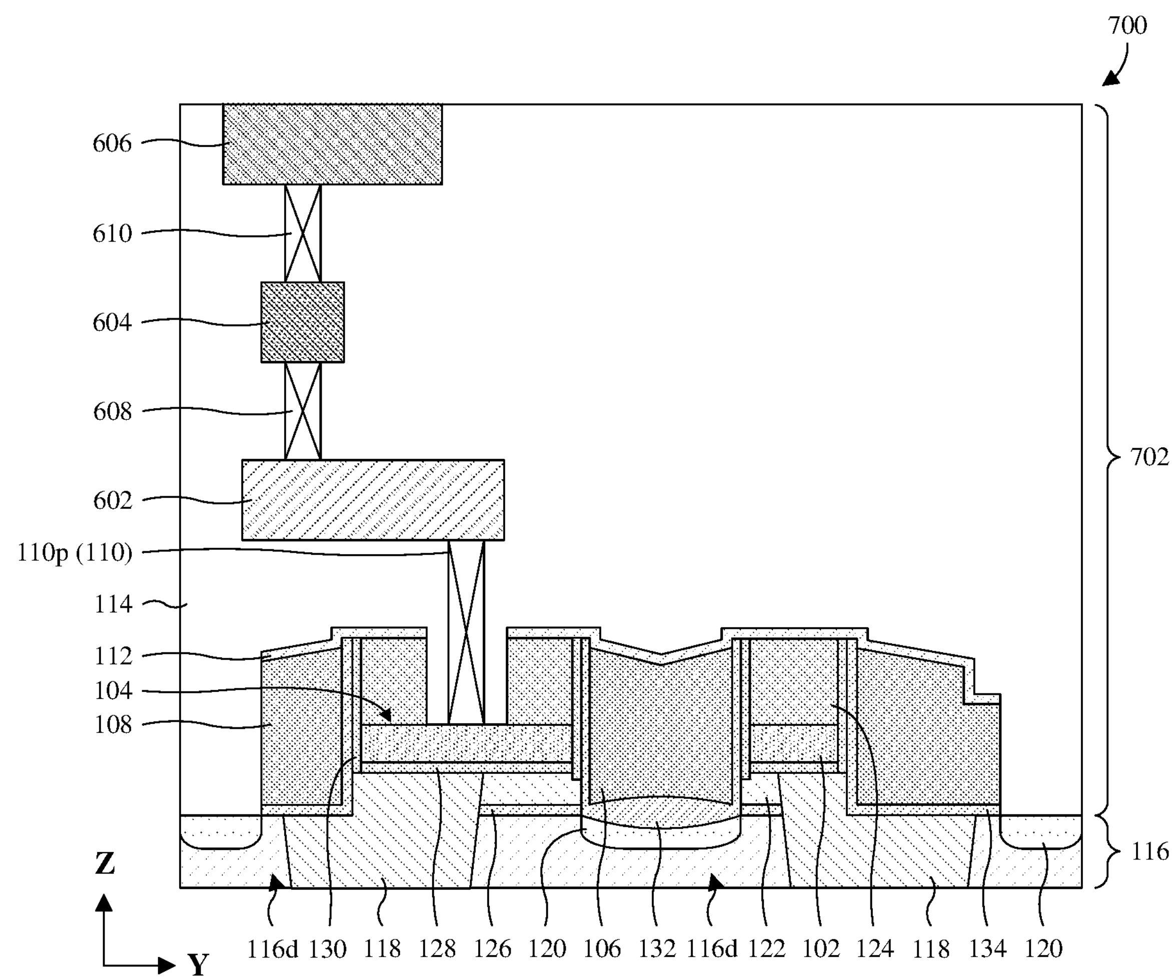
FIG. 7 illustrates a cross-sectional view of some embodiments of the integrated chip of FIGS. 5A, 5B, and 6 at a strap cell.

With reference to FIG. 7, a cross-sectional view 700 of some embodiments of the integrated chip of FIGS. 5A, 5B, and 6 is provided at one of the strap cells 502. The cross-sectional view 700 may, for example, be taken along line B in any one FIGS. 5A, 5B, and 6. The control gates 102, the erase gate 106, and the word lines 108 overlie a substrate 116, and the control gates 102 and the word lines 108 further overlie an isolation structure 118. The isolation structure 118 protrudes into a top of the substrate 116 to demarcate a device region 116*d* of the substrate 116, and source/drain regions 120 are in the device region 116*d* to sides of the isolation structure 118. Note that the control gates 102, the word lines 108, and the source/drain regions 120 are each only labeled once.

The control gates 102 also overlie individual floating gates 122 and are at least partially covered by individual control-gate hard masks 124. The floating gates 122 are spaced from the substrate 116 by individual floating-gate dielectric layers 126 and are spaced from the control gates 102 by individual control-gate dielectric layers 128. The control gates 102 are lined by individual control-gate sidewall spacers 130. Note that the floating gates 122, the control-gate hard masks 124, the floating-gate dielectric layers 126, the control-gate dielectric layers 128, and the control-gate sidewall spacers 130 are each only labeled once.

The erase gate 106 is lined by an erase-gate dielectric layer 132, and the word lines 108 are lined by individual word-line dielectric layers 134. Note that only one of the word-line dielectric layers 134 is labeled. The erase-gate dielectric layer 132 separates the erase gate 106 from the floating gates 122, the control-gate sidewall spacers 130, and the substrate 116. The word-line dielectric layers 134 separate the word lines 108 from the substrate 116, the isolation structure 118, and the control-gate sidewall spacers 130.

The control gates 102, the erase gate 106, and the word lines 108 are covered by a word-line hard mask layer 112 and an interconnect structure 702. The interconnect structure 702 comprises an interconnect dielectric layer 114, and further comprises a plurality of wires and a plurality of vias. The plurality of wires and the plurality of vias are stacked in the interconnect dielectric layer 114. The plurality of wires comprises a first-level pad wire 602, a second-level pad wire 604, and a third-level pad wire 606. The plurality of vias comprises a pad contact via 110*p*, a first-level pad via 608, and a second-level pad via 610.

With reference to FIGS. 8-20, a series of cross-sectional views 800-2000 of some embodiments of a method for forming an integrated chip is provided, where the integrated chip comprises control gates with pad regions protruding on both word-line sides of the control gates and erase-gate sides of the control gates. The method may be used to form the integrated chip(s) from any one or combination of FIGS. 1A, 1B, 2, 3A-3C, 4A, 4B, 5A, 5B, 6, and 7. Additionally, the cross-sectional views 800-2000 may, for example, be taken along line A in any one or combination of FIGS. 1A, 2, 5A, 5B, and 6.

Figure 8:
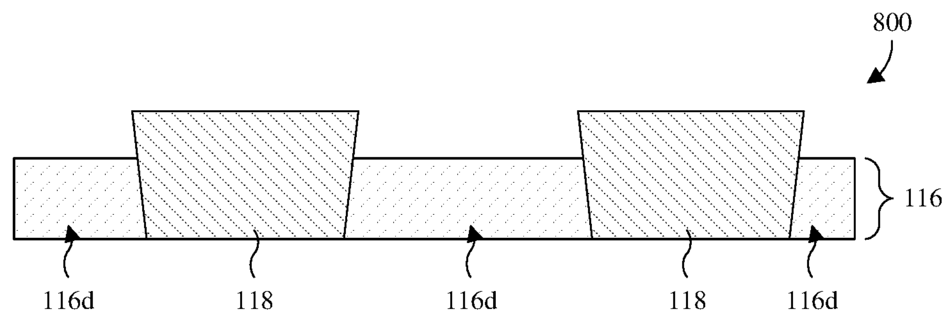
FIGS. 8-20 illustrate a series of cross-sectional views of some embodiments of a method for forming an integrated chip comprising control gates with pad regions protruding on both word-line sides of the control gates and erase-gate sides of the control gates.

As illustrated by the cross-sectional view 800 of FIG. 8, an isolation structure 118 is formed in a substrate 116, demarcating a device region 116*d*. The device region 116*d* may, for example, have a top layout as illustrated in any one or combination of FIGS. 2, 3A-3C, and 5B. The isolation structure 118 may, for example, have a top layout that is a negative of the top layout of the device region 116*d*. In some embodiments, a process for forming the isolation structure 118 comprises: 1) depositing a pad oxide layer on the substrate 116; 2) depositing a pad nitride layer on the pad oxide layer; 3) patterning the pad oxide and nitride layers with a layout of the isolation structure 118; 4) performing an etch into the substrate 116 with the pad oxide and nitride layers in place to form isolation openings; 5) filling the isolation openings with a dielectric material; and 6) removing the pad oxide and nitride layers. Other processes are, however, amenable.

Figure 9:
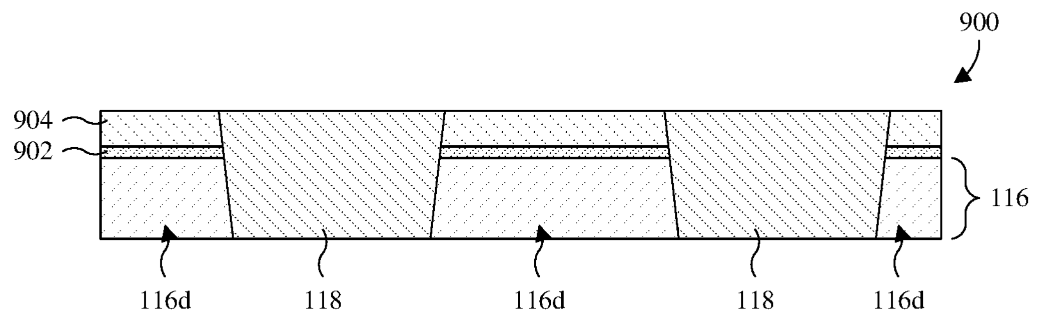

As illustrated by the cross-sectional view 900 of FIG. 9, a first dielectric layer 902 and a first conductive layer 904 (also known as a floating gate layer) are formed stacked on the substrate 116, between segments of the isolation structure 118. A process for forming the first dielectric layer 902 and the first conductive layer 904 may, for example, comprise: 1) depositing the first dielectric layer 902 on the substrate 116; 2) depositing the first conductive layer 904 on the first dielectric layer 902 and the isolation structure 118; and 3) performing a planarization into the first conductive layer 904 until the isolation structure 118 is reached. Other processes are, however, amenable. The depositing of the first dielectric layer 902 may, for example, be performed by thermal oxidation and/or some other suitable deposition process(es). The depositing of the first conductive layer 904 may, for example, be performed by vapor deposition and/or some other suitable deposition process(es).

Figure 10:
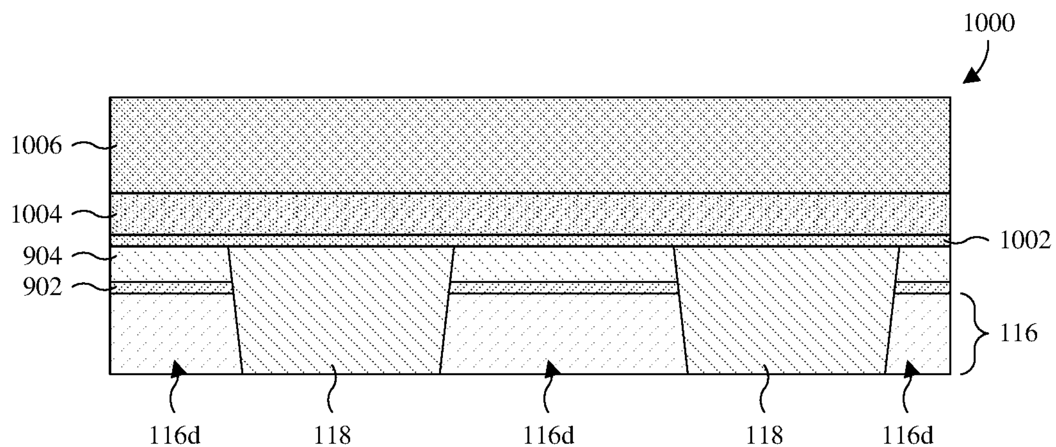

As illustrated by the cross-sectional view 1000 of FIG. 10, a second dielectric layer 1002, a second conductive layer 1004 (also known as a control gate layer), and a hard mask layer 1006 are formed stacked over the first conductive layer 904 and the isolation structure 118. The second dielectric layer 1002 and the hard mask layer 1006 may, for example, be or comprise silicon oxide, silicon nitride, some other suitable dielectric(s), or any combination of the foregoing. In some embodiments, the second dielectric layer 1002 is or comprises an oxide-nitride-oxide (ONO) film and/or the hard mask layer 1006 is or comprise an ONO film. The second conductive layer 1004 may be or comprise, for example, doped polysilicon and/or some other suitable conductive material(s).

Figure 11:
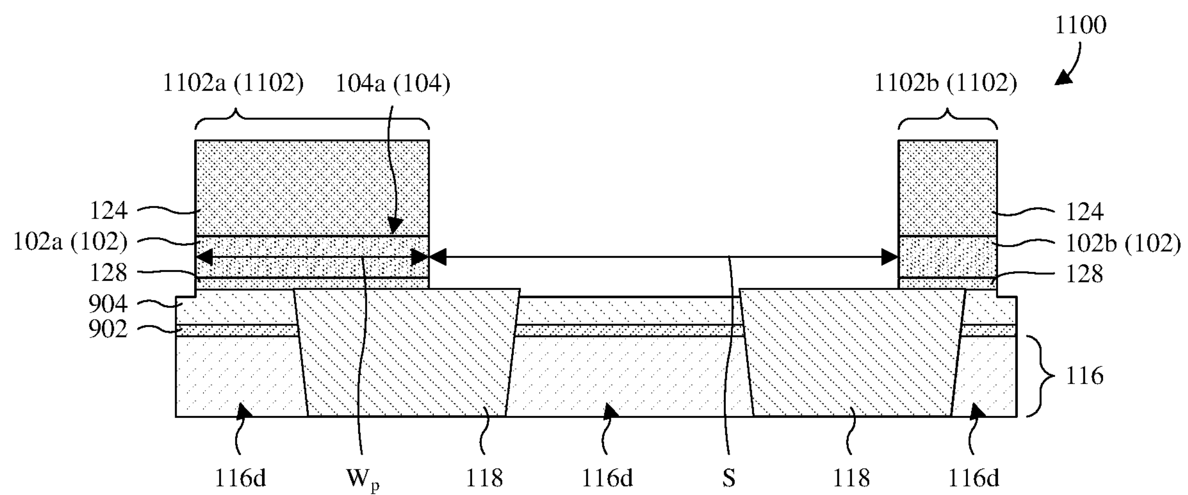

As illustrated by the cross-sectional view 1100 of FIG. 11, a plurality of control-gate stacks 1102 are formed from the second dielectric layer 1002 (see FIG. 10), the second conductive layer 1004 (see FIG. 10), and the hard mask layer 1006 (see FIG. 10). The control-gate stacks 1102 comprise individual control-gate dielectric layers 128, individual control gates 102, and individual control-gate hard masks 124. The control gates 102 respectively overlie the control-gate dielectric layers 128 and have individual pad regions 104 spaced along lengths of the control gates 102 (when viewed top down). The control-gate hard masks 124 respectively overlie the control gates 102. The plurality of control-gate stacks 1102 may, for example, have the same top layout as the plurality of control gates 102 in any one of FIGS. 5A, 5B, and 6. Other top layouts are, however, amenable.

The plurality of control-gate stacks 1102 comprises a first control-gate stack 1102*a* and a second control-gate stack 1102*b*, and the first and second control-gate stacks 1102*a*, 1102*b* respectively comprise a first control gate 102*a* and a second control gate 102*b*. The first control gate 102*a* has a first pad region 104*a* that protrudes (when viewed top down) both towards the second control gate 102*b* and away from the second control gate 102*b*. As such, a width $W_p$ of the first pad region 104*a* is spread amongst an erase-gate side of the first control gate 102*a* and a word-line side of the first control gate 102*a*. Further, the spacing S is large between the first and second control gates 102*a*, 102*b* and hence between the first and second control-gate stacks 1102*a*, 1102*b*. As discussed hereafter, a hard mask merge may be avoided while forming word lines between the first and second control-gate stacks 1102*a*, 1102*b* because the spacing S is large. The first control-gate stack 1102*a* may, for example, have a top layout as illustrated for the first control gate 102*a* in any one of FIGS. 1, 2, and 3A-3C and/or the second control-gate stack 1102*b* may, for example, have a top layout as illustrated for the second control gate 102*b* in any one of FIGS. 1, 2, and 3A-3C. Other top layouts are, however, amenable.

In some embodiments, a process for forming the control-gate stacks 1102 comprises: 1) patterning the hard mask layer 1006 with a control-gate pattern; and 2) performing an etch into the second dielectric layer 1002 and the second conductive layer 1004 with the hard mask layer 1006 in place to transfer the control-gate pattern. Other processes for forming control-gate stacks 1102 are, however, amenable. The patterning may, for example, be performed by a photolithography/etching process or some other suitable patterning process.

Figure 12:
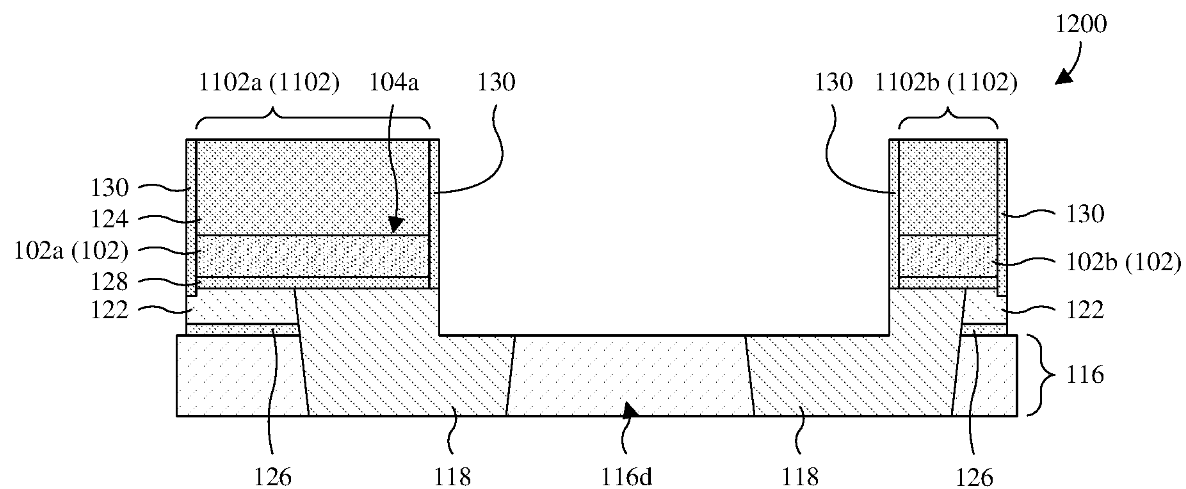

As illustrated by the cross-sectional view 1200 of FIG. 12, control-gate sidewall spacers 130 are formed on sidewalls of the control-gate stacks 1102. The control-gate sidewall spacers 130 may, for example, be or comprise silicon oxide, silicon nitride, some other suitable dielectric(s), or any combination of the foregoing. In some embodiments, the control-gate sidewall spacers 130 are or comprises an ONO film. In some embodiments, a process for forming the control-gate sidewall spacers 130 comprises: 1) depositing a sidewall spacer layer covering and lining the control-gate stacks 1102; and 2) performing an etch back into the sidewall spacer layer. Other processes are, however, amenable.

Also illustrated by the cross-sectional view 1200 of FIG. 12, floating gates 122 and floating-gate dielectric layers 126 are formed from the first conductive layer 904 (see FIG. 11) and the first dielectric layer 902 (see FIG. 11), respectively underlying the control-gate stacks 1102. In some embodiments, a process for forming the floating gates 122 and the floating-gate dielectric layers 126 comprises performing an etch into the first conductive layer 904 and the first dielectric layer 902 using the control-gate sidewall spacers 130 and the control-gate hard masks 124 as a mask. Other processes are, however, amenable.

Figure 13:
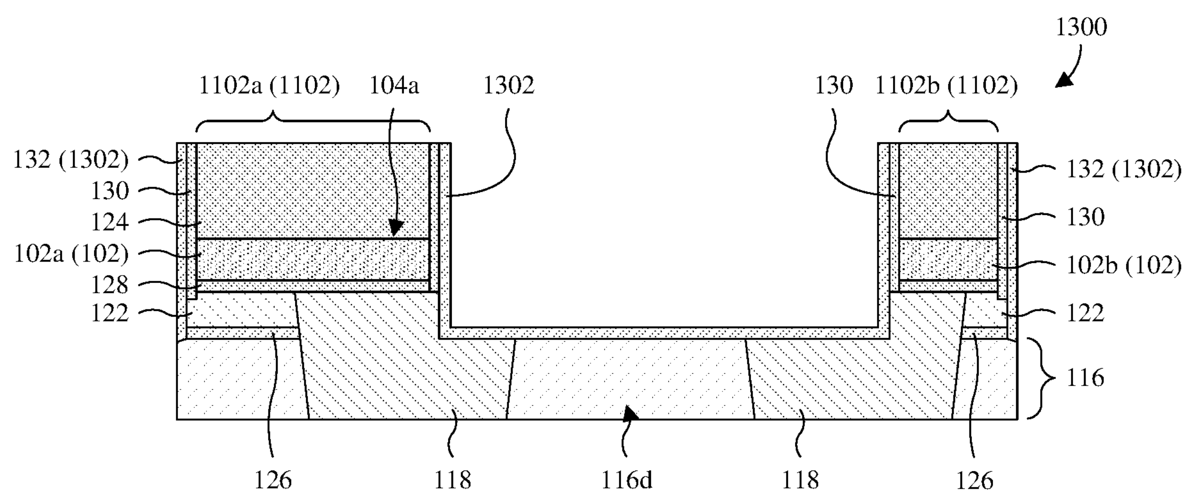

As illustrated by the cross-sectional 1300 of FIG. 13, a third dielectric layer 1302 (also known as a gate dielectric layer) is formed on sidewalls of the control-gate sidewall spacers 130 and sidewalls of the floating gates 122. Further, the third dielectric layer 1302 is formed lining the substrate 116 and the isolation structure 118 to sides of the control-gate stacks 1102. The third dielectric layer 1302 defines erase-gate dielectric layers 132 along sidewalls of the control-gate stacks 1102 that will border erase gates (not yet formed) and may be or comprise, for example, silicon oxide and/or some other suitable dielectric(s). A process for forming the third dielectric layer 1302 may, for example, comprise: 1) depositing a first dielectric portion of the third dielectric layer 1302 covering and lining the control-gate stacks 1102; 2) etching back the first dielectric portion; and 3) depositing a second dielectric portion of the third dielectric layer 1302 on the substrate 116. Other processes are, however, amenable. The first dielectric portion may, for example, be formed by vapor deposition and/or some other suitable deposition process(es), and/or the second dielectric portion may, for example, be formed by thermal oxidation and/or some other suitable deposition process(es).

Figure 14:
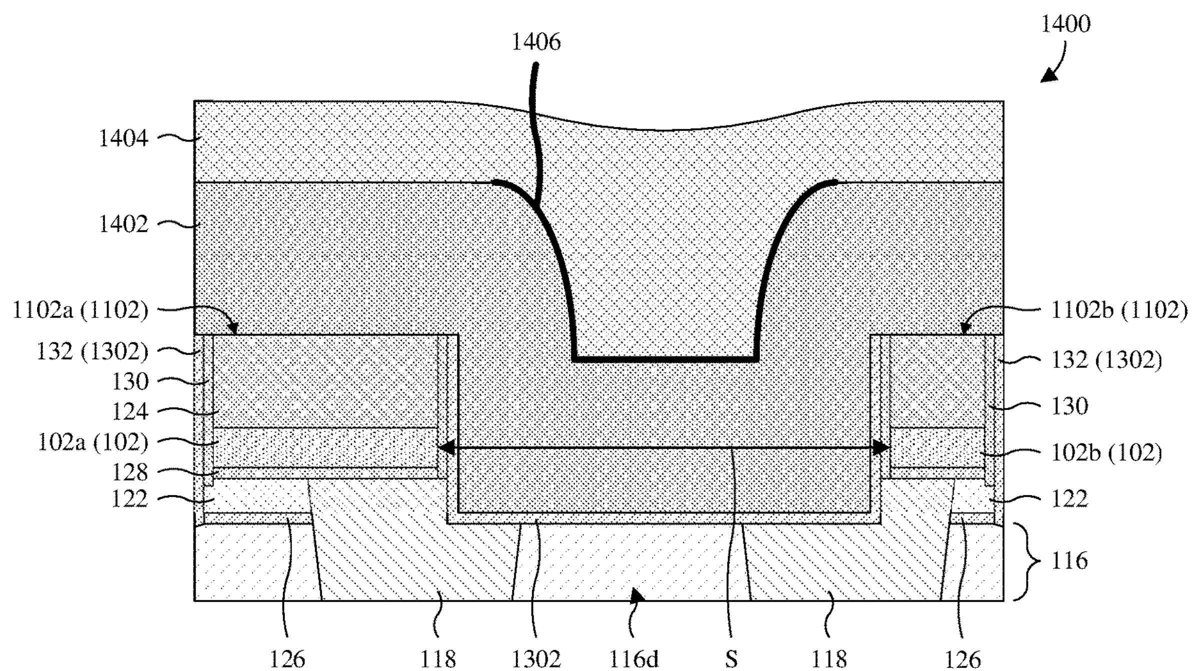

As illustrated by the cross-sectional view 1400 of FIG. 14, a third conductive layer 1402 (also known as a gate layer) and a first antireflective layer 1404 are formed stacked over and covering the substrate 116 and the control-gate stacks 1102. The third conductive layer 1402 forms indents to sides of the control-gate stacks 1102 due to the drop in elevation from the control-gate stacks 1102 to the spaces between the control-gate stacks 1102. For example, a first indent 1406 (filled by the first antireflective layer 1404) forms between the first and second control-gate stacks 1102*a*, 1102*b* due to the drop in elevation from the first and second control-gate stacks 1102*a*, 1102*b* to the space between the first and second control-gates stacks 1102*a*, 1102*b*. The third conductive layer 1402 may, for example, be or comprise doped polysilicon and/or some other suitable conductive material. The first antireflective layer 1404 may, for example, be or comprise a bottom antireflective coating (BARC) material and/or some other suitable antireflective material.

Figure 15:
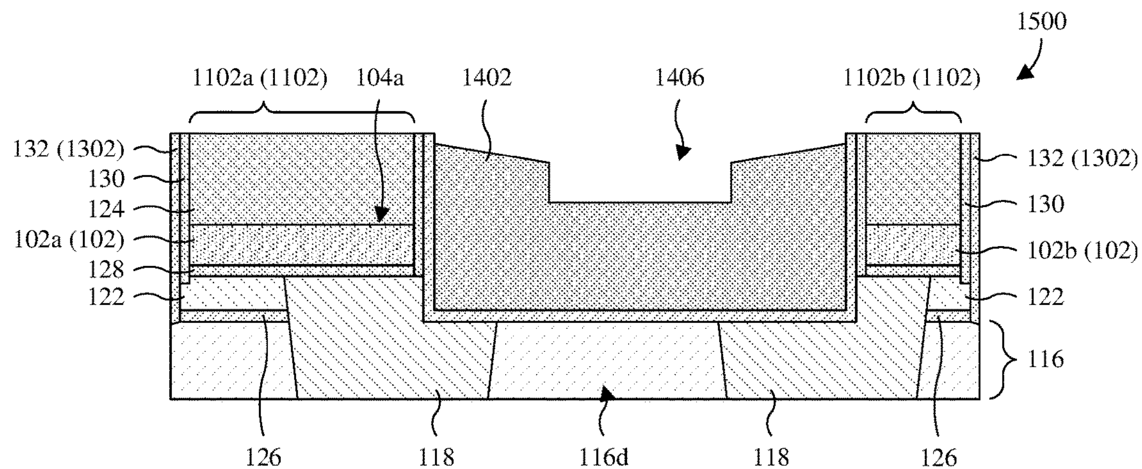

As illustrated by the cross-sectional view 1500 of FIG. 15, a top surface of the third conductive layer 1402 is recessed to below top surfaces of the control-gate stacks 1102 and the first antireflective layer 1404 is subsequently removed. While not show, the recessing may form erase gates from the third conductive layer 1402. The erase gates are on the erase-gate dielectric layers 132 and may, for example, have the same top layout as the erase gates 106 in any one of FIGS. 5A and 5B. Further, an erase gate adjoining the first control-gate stack 1102*a* may, for example, have the same layout as the first erase gate 106*a* in any one of FIGS. 1A, 2, and 3A-3C, and/or an erase gate adjoining the second control-gate stack 1102*b* may, for example, have the same layout as the second erase gate 106*b* in any one of FIGS. 1A, 2, and 3A-3C. The recessing may, for example, be performed by an etch back and/or some other suitable process (es). The etch back may, for example, comprise: 1) etching the first antireflective layer 1404 until the third conductive layer 1402 is uncovered; and 2) simultaneously etching the third conductive layer 1402 and the first antireflective layer 1404 until the top surface of the third conductive layer 1402 is recessed to below the top surfaces of the control-gate stacks 1102. The removal may, for example, be performed by plasma ashing and/or some other suitable process.

Figure 16:
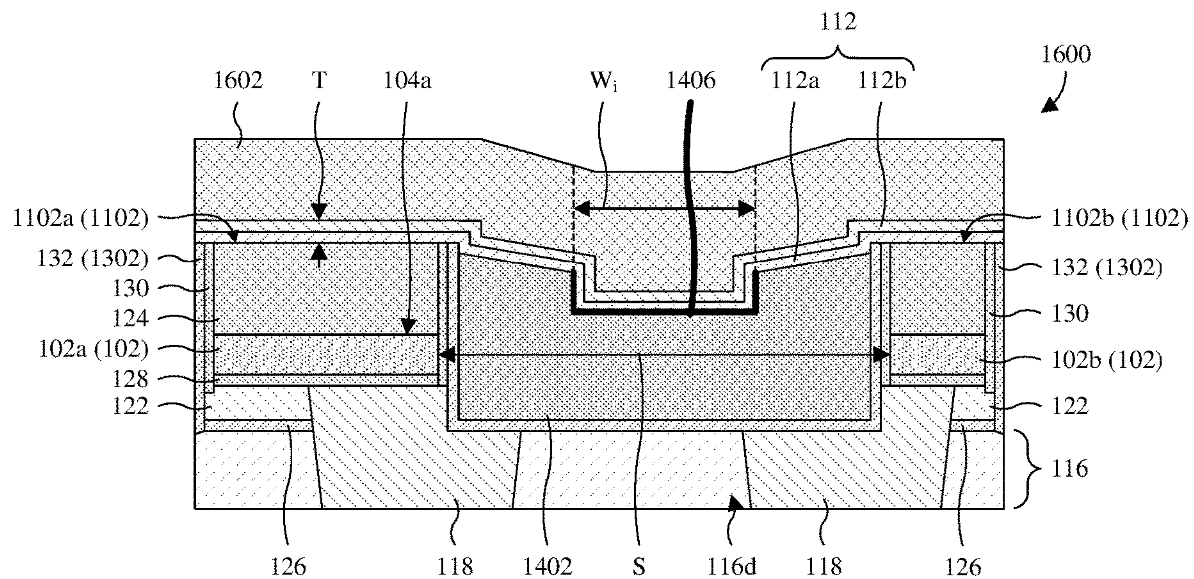

As illustrated by the cross-sectional view 1600 of FIG. 16, a word-line hard mask layer 112 is formed on the control-gate stacks 1102 and the third conductive layer 1402. The word-line hard mask layer 112 conforms to and lines the first indent 1406 in the third conductive layer 140. Because the spacing S between the first and second control-gate stacks 1102*a*, 1102*b* is large, a width $W_i$ of the first indent 1406 is large. The width $W_i$ may, for example, be large in that it is about 2, 3, 5, 10, or more times greater than a thickness T of the word-line hard mask layer 112. Other suitable multiples are, however, amenable. Because the width $W_i$ of the first indent 1406 is large, the word-line hard mask layer 112 does not merge at the first indent 1406. That is to say, portions of the word-line hard mask layer 112 on opposite sidewalls of the first indent 1406 do not merge or contact. In some embodiments, the word-line hard mask layer 112 comprises a first word-line hard mask layer 112*a* and a second word-line hard mask layer 112*b*. The first word-line hard mask layer 112*a* may be or comprise, for example, silicon oxide and/or some other suitable dielectric(s). The second word-line hard mask layer 112*b* may be or comprise, for example, silicon nitride and/or some other suitable dielectric(s). The word-line hard mask layer 112 may, for example, be formed by conformal deposition, vapor deposition, some other suitable deposition process(es), or any combination of the foregoing.

Also illustrated by the cross-sectional view 1600 of FIG. 16, a second antireflective layer 1602 is formed covering the word-line hard mask layer 112. The second antireflective layer 1602 may, for example, be or comprise a BARC material and/or some other suitable antireflective material.

Figure 17:
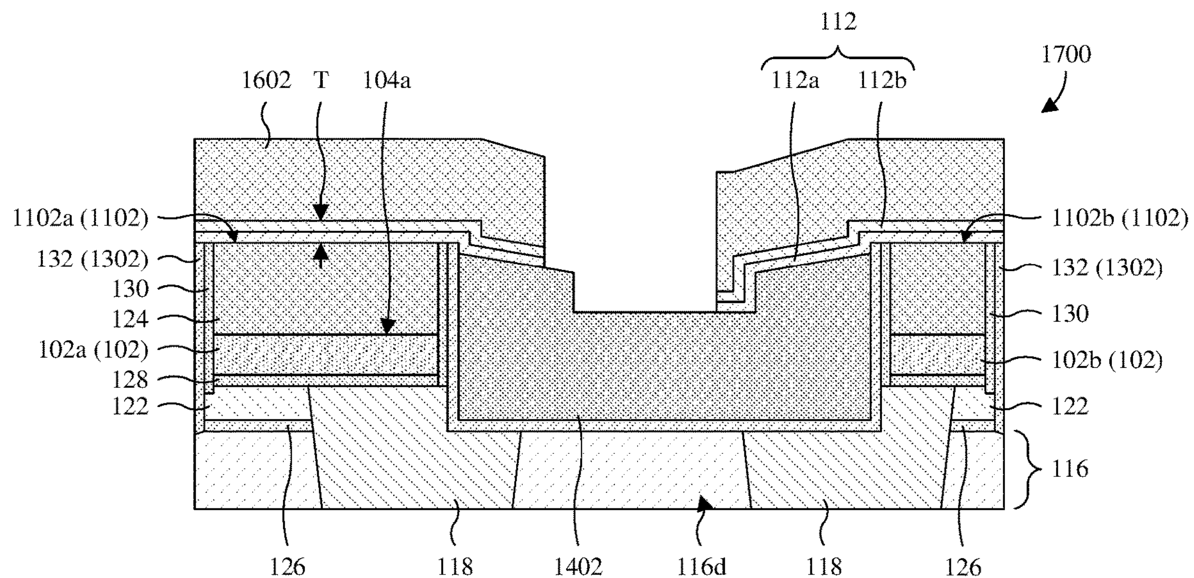

As illustrated by the cross-sectional view 1700 of FIG. 17, the second antireflective layer 1602 and the word-line hard mask layer 112 are patterned with a word-line pattern. In some embodiments, the patterning comprises: 1) forming the word-line pattern in the second antireflective layer 1602; and 2) performing an etch into the word-line hard mask layer 112 with the second antireflective layer 1602 in place. Other processes are, however, amenable. The word-line pattern may, for example, be formed in the second antireflective layer 1602 by a photolithography/etching process or some other suitable process.

Because the word-line hard mask layer 112 did not merge between the first and second control-gate stacks 1102*a*, 1102*b*, the thickness T of the word-line hard mask layer 112 is uniform or substantially uniform from the first control-gate stack 1102*a* to the second control-gate stack 1102*b*. Because the thickness T of the word-line hard mask layer 112 is uniform or substantially uniform, patterning is uniform across the word-line hard mask layer 112 and the word-line layout is accurately formed in the word-line hard mask layer 112. For example, the etch may be performed with high uniformity to accurately transfer the word-line pattern from the second antireflective layer 1602 to the word-line hard mask layer 112.

Figure 18:
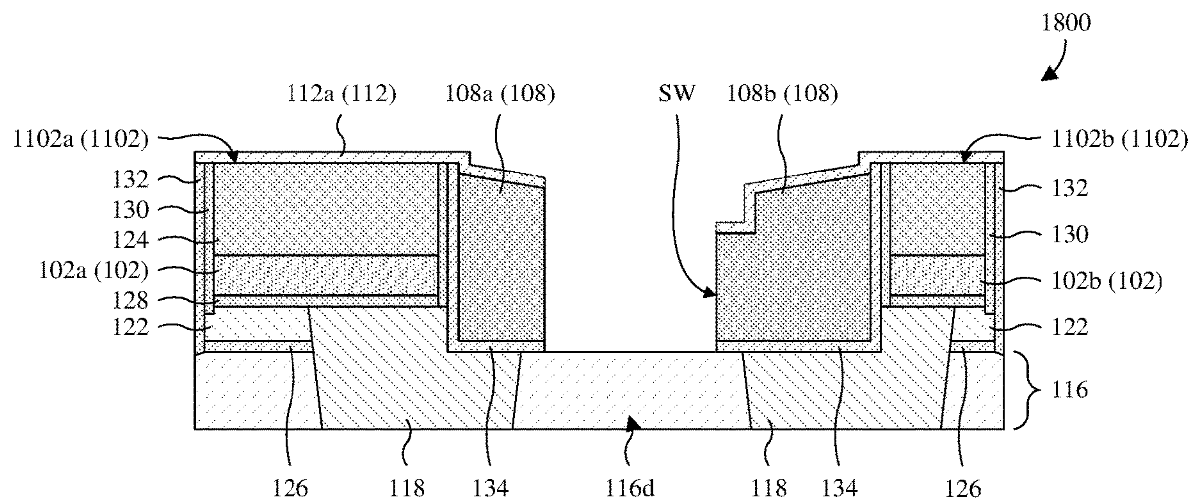

As illustrated by the cross-sectional view 1800 of FIG. 18, the second antireflective layer 1602 is removed. The removal may, for example, be performed by plasma ashing or some other suitable removal process.

Also illustrated by the cross-sectional view 1800 of FIG. 18, an etch is performed into the third conductive layer 1402 (see FIG. 17) and the third dielectric layer 1302 (see FIG. 17). The etch transfers the word-line pattern from the word-line hard mask layer 112 to the third conductive layer 1402 and the third dielectric layer 1302, thereby forming a plurality of word lines 108 and a plurality of word-line dielectric layers 134. The word lines 108 are formed along sidewalls of the control-gate stacks 1102, and the word-line dielectric layers 134 line the word lines 108. The plurality of word lines 108 may, for example, have the same top layout as the plurality of word lines 108 in any one of FIGS. 5A and 5B. Other top layouts are, however, amenable. In some embodiments, the etch also removes and/or otherwise erodes away the second word-line hard mask layer 112*b* (see FIG. 17).

The plurality of word lines 108 comprises a first word line 108*a* and a second word line 108*b* between and respectively bordering the first and second control-gate stacks 1102*a*, 1102*b*. The first word line 108*a* may, for example, have a top layout as illustrated for the first word line 108*a* in any one of FIGS. 1A, 2, and 3A-3C and/or the second word line 108*b* may, for example, have a top layout as illustrated for the second word line 108*b* in any one of FIGS. 1, 2, and 3A-3C. Other top layouts are, however, amenable.

Because word-line hard mask layer 112 accurately describes the word-line pattern, the word-line pattern is accurately transferred to the third conductive layer 1402 by the etch. As a result, the likelihood of etch residue defining leakage paths between the first and second word lines 108*a*, 108*b* is low. Hence, the process window (e.g., resiliency) of the etch is large and bulk manufacturing yields are high. Additionally, the first and second word lines 108*a*, 108*b* may have substantially vertical sidewall profiles SW. The substantially vertical sidewall profiles SW may increase uniformity along and/or between the first and second word line 108*a*, 108*b* and may increase the uniformity of operating parameters for devices defined in part by the first and second word lines 108*a*, 108*b*. The increased uniformity may reduce the likelihood that the devices will fail and may therefore increase bulk manufacturing yields.

Figure 19:
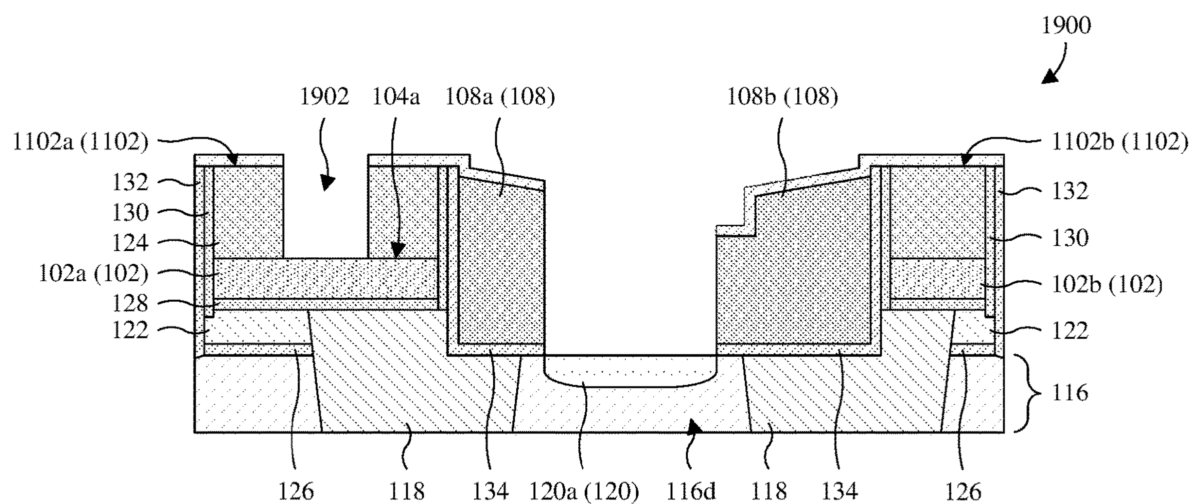

As illustrated by the cross-sectional view 1900 of FIG. 19, the control-gate hard masks 124 are patterned at pad regions (e.g., 104*a*) of the control gates 102 to form contact openings 1902 exposing the control gates 102. The patterning may, for example, be performed by a photolithography/etching process and/or some other suitable patterning process(es).

Also illustrated by the cross-sectional view 1900 of FIG. 19, source/drain regions 120 are formed in the substrate 116, adjacent the word lines 108. For example, a first source/drain region 120*a* may be formed in the substrate 116, between and bordering the first and second word lines 108*a*, 108*b*. The forming may, for example, be performed by ion implantation and/or some other suitable doping process.

Figure 20:
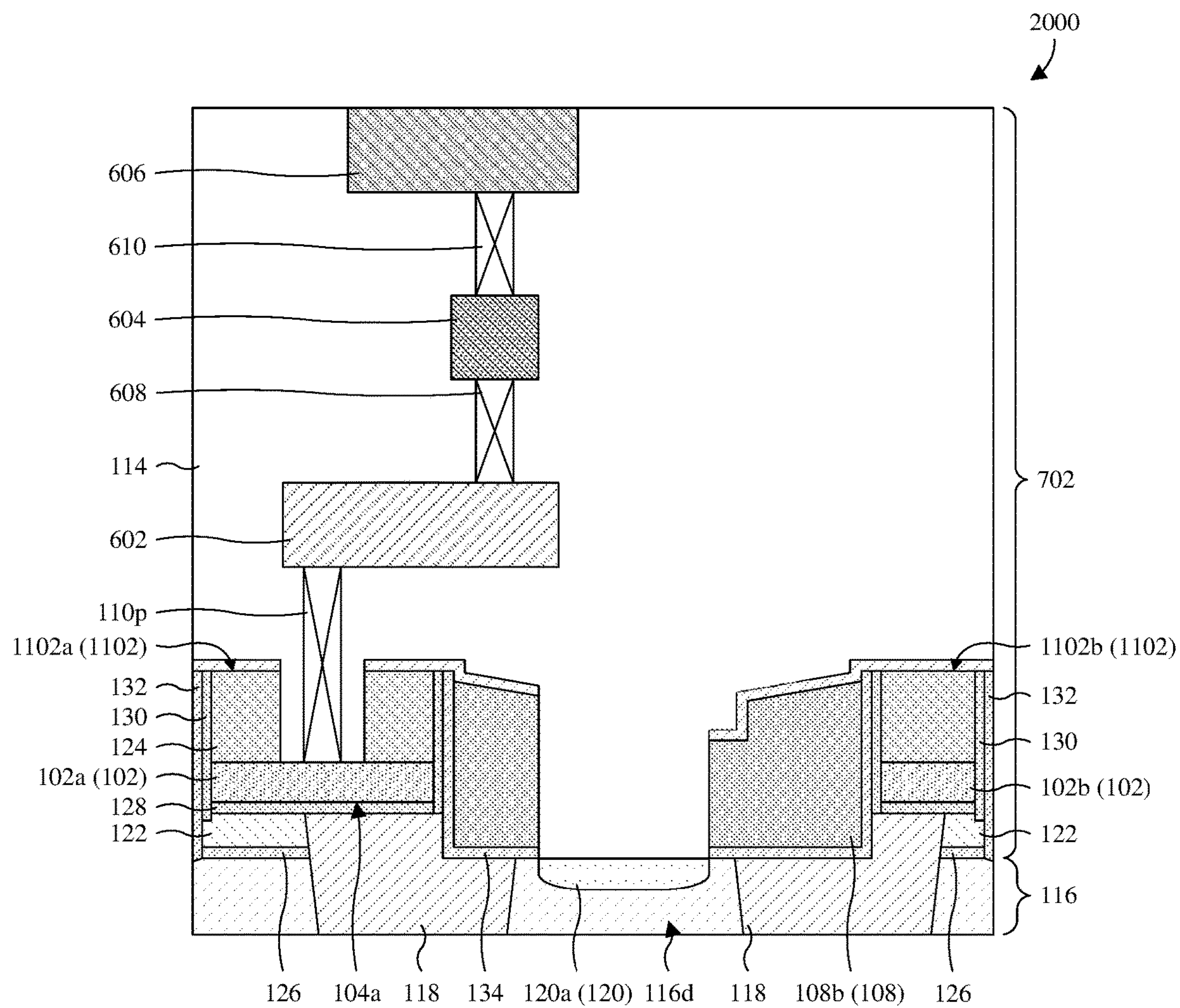

As illustrated by the cross-sectional view 2000 of FIG. 20, an interconnect structure 702 is formed covering the word lines 108 and the control-gate stacks 1102. The interconnect structure 702 comprises an interconnect dielectric layer 114, and further comprises a plurality of wires and a plurality of vias. The plurality of wires comprises a first-level pad wire 602, a second-level pad wire 604, and a third-level pad wire 606. The plurality of vias comprises a pad contact via 110*p*, a first-level pad via 608, and a second-level pad via 610. The first-level pad wire 602, the second-level pad wire 604, and the third-level pad wire 606 may, for example, have top layouts as shown in FIG. 6. Other top layouts are, however, amenable.

In some embodiments, a process for forming the interconnect structure 702 comprises: 1) forming the pad contact via 110*p* by a single damascene process; 2) forming the first-level pad wire 602 by the single damascene process; 3) forming the first-level pad via 608 and the second-level pad wire 604 by a dual damascene process; and 4) forming the second-level pad via 610 and the third-level pad wire 606 by a dual damascene process. Other processes are, however, amenable. In some embodiments, the single damascene process comprises: 1) depositing a dielectric layer; 2) patterning the dielectric layer with openings for a single level of conductive features (e.g., a level of vias or a level of wires); 3) and filling the openings with conductive material to form the single level of conductive features. In some embodiments, the dual damascene process comprises: 1) depositing a dielectric layer; 2) patterning the dielectric layer with openings for two levels of conductive features (e.g., a level of vias and a level of wires); 3) and filling the openings with conductive material to form the two levels of conductive features. In both the single and dual damascene processes, the dielectric layer corresponds to a portion of the interconnect dielectric layer 114.

While FIGS. 8-20 are described with reference to a method, it will be appreciated that the structures shown in FIGS. 8-20 are not limited to the method but rather may stand alone separate of the method. Further, while FIGS. 8-20 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 21:
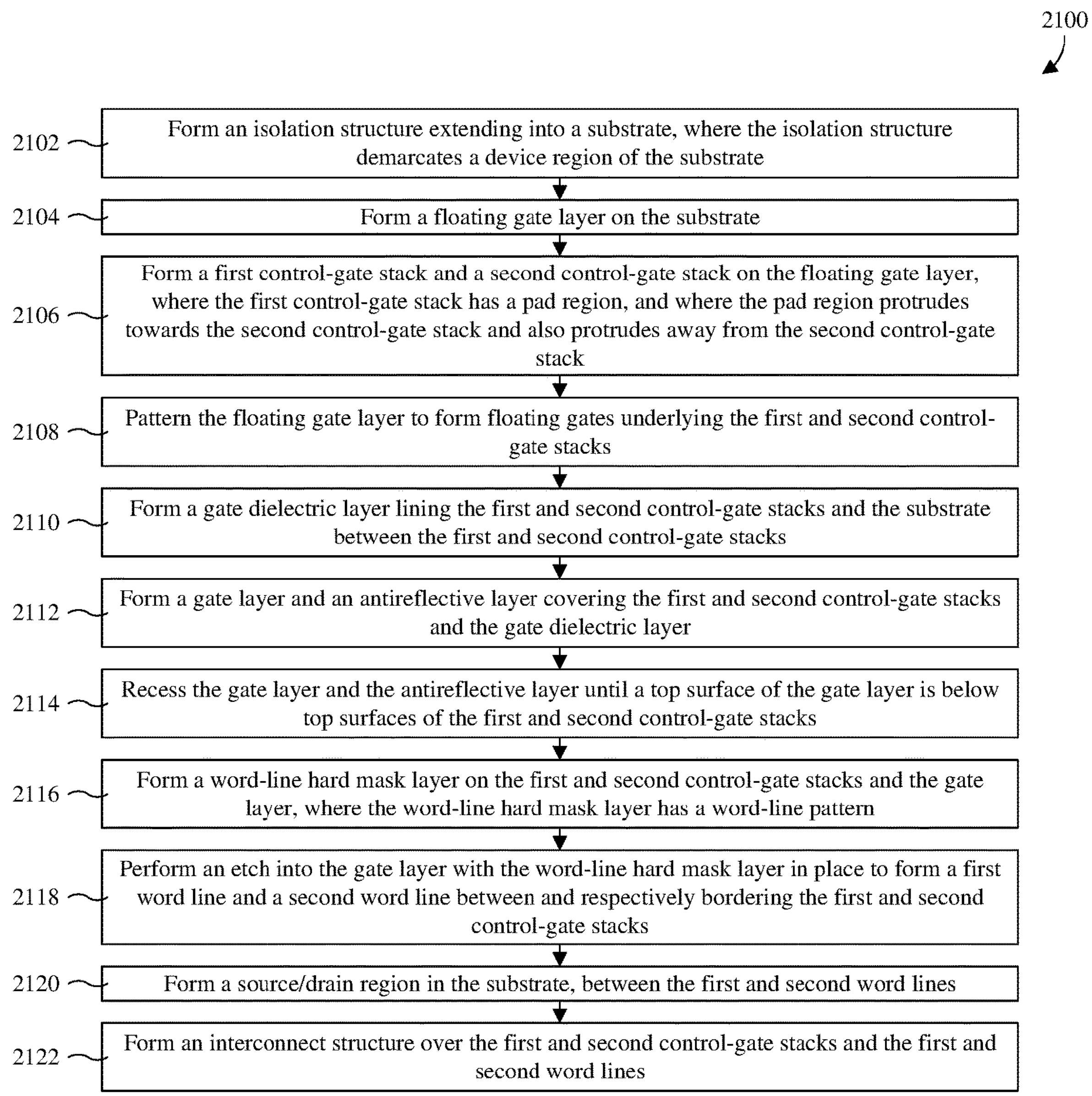
FIG. 21 illustrates a block diagram of some embodiments of the method of FIGS. 8-20.

With reference to FIG. 21, a block diagram 2100 of some embodiments of the method of FIGS. 8-20 is illustrated.

At 2102, an isolation structure is formed extending into a substrate, where the isolation structure demarcates a device region of the substrate. See, for example, FIG. 8.

At 2104, a floating gate layer is formed on the substrate. See, for example, FIG. 9.

At 2106, a first control-gate stack and a second control-gate stack are formed on the floating gate layer, where the first control-gate stack has a pad region. The pad region protrudes towards the second control-gate stack on a word-line side of the first control-gate stack, and also protrudes away from the second control-gate stack on an erase-gate side of the first control-gate stack. See, for example, FIGS. 10 and 11. Because the pad region protrudes on both the word-line and erase-gate sides of the first control-gate stack, a width of the pad region is spread amongst these two sides and a spacing between the first and second control-gate stacks is large at the pad region. As discussed above, this prevents a hard mask merge while forming word lines.

At 2108, the floating gate layer is patterned to form floating gates underlying the first and second control-gate stacks. See, for example, FIG. 12.

At 2110, a gate dielectric layer is formed lining the first and second control-gate stacks and the substrate between the first and second control-gate stacks. See, for example, FIG. 13.

At 2112, a gate layer and an antireflective layer are formed covering the first and second control-gate stacks and the gate dielectric layer. See, for example, FIG. 14. The gate layer has an indent between the gate layer due to the change in topography from the first and second control-gate stacks to the space between the first and second control-gate stacks.

At 2114, the gate layer and the antireflective layer are recessed until a top surface of the gate layer is below top surfaces of the first and second control-gate stacks. See, for example, FIG. 15. Also, the indent persists after the recessing.

At 2116, a word-line hard mask layer is formed on the first and second control-gate stacks and the gate layer, where the word-line hard mask layer has a word-line pattern. See, for example, FIGS. 16 and 17. The forming comprises depositing the word-line hard mask layer and patterning the word-line hard mask layer with the word-line pattern. Because the spacing between the first and second control-gate stacks is large at the pad region, the width of the indent is large at the pad region. Because the width of the indent is large, the word-line hard mask layer lines the indent without merging in the indent. Further, a thickness of the word-line hard mask layer is uniform or substantially uniform from the first control-gate stack to the second control-gate stack. Accordingly, patterning may be performed uniformly across the word-line hard mask layer and the word-line pattern may be accurately formed in the word-line hard mask layer.

At 2118, an etch is performed into the gate layer with the word-line hard mask layer in place to form a first word line and a second word line between and respectively bordering the first and second control-gate stacks. See, for example, FIG. 18. Because the word-line hard mask layer has a uniform or substantially uniform thickness, it provides uniform protection to masked portions of the gate layer during the etch. Because of the uniform protection during the etch, and because the word-line hard mask layer accurately describes the word-line pattern, the etch accurately transfers the word-line pattern to the gate layer. Accordingly, the risk of etch residue defining leakage paths between the first and second word lines is low and sidewall profiles of the first and second word lines are vertical or substantially vertical. The low likelihood of leakage paths enlarges the process window (e.g., increases the resiliency) of the etch and increases bulk manufacturing yields. The vertical or substantially vertical sidewall profiles increase the uniformity of operating parameters for devices defined in part by the first and second word lines and hence further increases bulk manufacturing yields.

At 2120, a source/drain region is formed in the substrate, between the first and second word lines. See, for example, FIG. 19.

At 2122, an interconnect structure is formed over the first and second control-gate stacks and the first and second word lines. See, for example, FIG. 20.

While the block diagram 2100 of FIG. 21 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides an integrated chip including: a memory array including a plurality of cells in a plurality of rows and a plurality of columns, wherein the plurality of rows includes a first row; an erase gate and a first word line elongated along the first row of the memory array; and a first control gate elongated along the first row, wherein the first control gate is between and borders the erase gate and the first word line, and wherein the first control gate has a first pad region protruding towards the erase gate and the first word line. In some embodiments, the erase gate and the first word line conform to first pad region. In some embodiments, the first pad region protrudes towards the erase gate and the first word line by the same amount. In some embodiments, the integrated chip further includes a contact via overlying and contacting the first pad region. In some embodiments, the first control gate has a second pad region protruding towards the erase gate and the first word line. In some embodiments, a width of the first control gate is substantially uniform from the first pad region to the second pad region. In some embodiments, the integrated chip further includes a metal line elevated above the first control gate and elongated in parallel with the first row, wherein the metal line partially defines a conductive path from the first pad region to the second pad region. In some embodiments, the plurality of rows includes a second row and the integrated chip further includes: a second word line elongated along the second row of the array; and a second control gate elongated along the second row, wherein the second control gate is between and borders the erase gate and the second word line, wherein the second control gate has a second pad region protruding towards the erase gate and the second word line, and wherein the first and second pad regions are respectively on opposite sides of the erase gate and are diagonally opposite.

In some embodiments, the present application provides another integrated chip including: a first control gate and a second control gate, wherein the first and second control gates are elongated in parallel and respectively have a first pad region and a second pad region, wherein the first control gate has a first width from the first pad region to about even with the second pad region, and wherein the first control gate has a second width greater than the first width at the first pad region; and an erase gate elongated in parallel with and bordering the first control gate, wherein the erase gate has a control-gate side indented at and conforming to the first pad region. In some embodiments, the erase gate is between and borders the first and second control gates, wherein the erase gate wraps around edges of the second pad region. In some embodiments, the second control gate has the first width from the second pad region to about even with the first pad region, and wherein the second control gate has the second width at the second pad region. In some embodiments, the integrated chip further includes a first word line and a second word line, wherein the first and second word lines are between the first and second control gates, and wherein the first and second word lines respectively wrap around portions of the first and second pad regions. In some embodiments, the integrated chip further includes a source/drain region between and bordering the first and second word lines. In some embodiments, a distance between the first and second control gates at the first pad region is greater than about 0.39 micrometers. In some embodiments, the integrated chip further includes an isolation structure partially underlying the first and second pad regions.

In some embodiments, the present application provides a method for forming an integrated chip, the method including: forming a first control-gate stack and a second control-gate stack on a substrate, wherein the first control-gate stack has a first protrusion protruding towards the second control-gate stack, and further has a second protrusion protruding away from the second control-gate stack at a location even with the first protrusion; depositing a gate layer over the first and second control-gate stacks; and patterning the gate layer to form a first erase gate and a first word line, wherein the first erase gate and the first word line are respectively on opposite sides of the first control-gate stack, and wherein the first word line and the first erase gate respectively conform to the first and second protrusions. In some embodiments, the patterning includes: etching back the gate layer until a top surface of the gate layer is below top surfaces respectively of the first and second control-gate stacks; depositing a hard mask layer over the first and second gate stacks and the gate layer, wherein a thickness of the hard mask layer is substantially uniform from the first control-gate stack to the second control-gate stack; patterning the hard mask layer with a word-line pattern; and performing an etch into the gate layer with the hard mask layer in place. In some embodiments, the method further includes implanting dopants into the substrate to form a source/drain region adjacent to the first word line. In some embodiments, the patterning forms the first word line with a word-line sidewall facing the second control-gate stack, wherein the word-line sidewall is substantially vertical. In some embodiments, the forming of the first and second control gates includes: depositing a control gate layer on the substrate; and performing an etch into the control gate layer to transfer a control-gate pattern to the control gate layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:

forming a first control-gate stack and a second control-gate stack elongated in parallel with a first axis, wherein the first control-gate stack has a first protrusion protruding towards the second control-gate stack from a first sidewall of the first control-pate stack and has a second protrusion protruding away from the second control-gate stack from a second sidewall of the first control-pate stack, and wherein the first and second protrusions define a pad, overlap with and protrude along a second axis orthogonal to the first axis;

depositing a gate layer over the first and second control-gate stacks; and patterning the gate layer to form an erase gate and a word line respectively on opposite sides of the first control-gate stack, wherein a sidewall of the word line has a first indent receiving and conforming to the first protrusion, and wherein a sidewall of the erase gate has a second indent receiving and conforming to the second protrusion; wherein the pad is between the erase gate and the word line along the second axis, wherein the first sidewall of the first control-pate stack faces and borders the sidewall of the word line, wherein the second sidewall of the first control-pate stack faces and borders the sidewall of the erase pate, and wherein the first and second sidewalls of the first control-pate stack extend linearly and continuously from the pad to a second pad with a constant separation between the first and second sidewalls.

2. The method according to claim 1, wherein the patterning comprises:

etching back the gate layer until a top surface of the gate layer is below top surfaces respectively of the first and second control-gate stacks, wherein the gate layer has a U-shaped profile between the first and second control-gate stacks at completion of the etching back;

after the etching back, depositing a hard mask layer over the first and second control-gate stacks and the gate layer, wherein a thickness of the hard mask layer is substantially uniform from the first control-gate stack to the second control-gate stack;

patterning the hard mask layer with a word-line pattern; and performing an etch into the gate layer with the hard mask layer in place to transfer the word-line pattern from the hard mask layer to the gate layer to form the word line.

3. The method according to claim 1, further comprising:

implanting dopants into a substrate underlying the first and second control-gate stacks to form a source/drain region adjacent to the word line.

4. The method according to claim 1, wherein a width of the first control-gate stack is less than that of the pad continuously from the pad to the second pad, and wherein the width extends in parallel with the second axis.

5. The method according to claim 1, wherein the first protrusion has a sidewall edge-to-edge with the first sidewall of the first control-gate stack and extending laterally transverse to the first axis, and wherein the second protrusion has a sidewall edge-to-edge with the second sidewall of the first control-gate stack and extending laterally transverse to the first axis.

6. The method according to claim 1, wherein the word line has a curved concave sidewall edge-to-edge with the sidewall of the word line and wholly demarcating the first indent, wherein the erase gate has a curved concave sidewall edge-to-edge with the sidewall of the erase gate and wholly demarcating the second indent, wherein the first and second indents share a first maximum width in a direction parallel to the first axis, and wherein the first and second protrusions share a second maximum width in the direction.

7. The method according to claim 1, wherein the first indent is demarcated by three individual sidewalls of the word line, which respectively face and border three individual sidewalls of the first protrusion and which are distinct from the sidewall of the word line, wherein the second indent is demarcated by three individual sidewalls of the erase gate, which respectively face and border three individual sidewalls of the second protrusion and which are distinct from the sidewall of the erase gate, and wherein the first and second indents have a same width extending parallel to the first axis.

8. A method comprising:

forming a floating gate layer overlying a substrate;

depositing a control gate layer overlying the floating gate layer;

patterning the control and floating gate layers to form a control gate stack elongated along a first axis and comprising a first pad and a second pad that are both on the first axis;

depositing a gate layer covering the control gate stack; and patterning the gate layer to form an erase gate and a word line respectively on opposite sides of and elongated in parallel with the control gate stack, wherein the erase gate and the word line each extends along multiple sidewalls of the first pad and each extends along multiple sidewalls of the second pad, wherein the multiple sidewalls of the first pad along which the erase gate extends comprise a first sidewall facing away from the second pad and a second sidewall facing the second pad, wherein the multiple sidewalls of the second pad along which the word line extends comprise a third sidewall facing away from the first pad and a fourth sidewall facing the first pad, wherein the first and third sidewalls extend respectively along a second axis and a third axis, wherein the erase gate is continuous from the second axis to the third axis, wherein the first and second sidewalls share a first common length in a direction orthogonal to the first axis, and wherein the third and fourth sidewalls share a second common length in the direction.

9. The method according to claim 8, wherein the first and second pads have individual first protrusions protruding in a first direction parallel to the second and third axes from a first common sidewall and further have individual second protrusions protruding in a second direction opposite the first direction from a second common sidewall, and wherein a separation between the first and second common sidewalls is uniform from the first pad to the second pad.

10. The method according to claim 8, wherein the first and second pads are symmetrical about the first axis.

11. The method according to claim 8, further comprising:

forming a trench isolation structure extending into the substrate with a top surface elevated above a top surface of the substrate;

wherein the forming of the floating gate layer comprises depositing the floating gate layer covering the trench isolation structure and the substrate and subsequently performing a planarization into the floating gate layer until a top surface of the floating gate layer is level with that of the trench isolation structure.

12. The method according to claim 8, wherein the multiple sidewalls of the second pad along which the erase gate extends comprise a fifth sidewall facing away from the first pad and extending along the third axis, and wherein the multiple sidewalls of the first pad along which the word line extends comprise a sixth sidewall facing away from the second pad and extending along the second axis.

13. The method according to claim 8, wherein the multiple sidewalls of the first pad along which the word line extends comprise a fifth sidewall facing away from the second pad and a sixth sidewall facing the second pad, wherein the fifth and sixth sidewalls share a third common length in the direction, and wherein the first common length and the third common length are different.

14. The method according to claim 8, wherein the control gate stack has a pair of sidewalls extending linearly from the first pad to the second pad with a constant separation between the pair of sidewalls.

15. A method comprising:

depositing a first conductive layer and a hard mask layer stacked over a substrate;

performing a first etch selectively into the first conductive layer and the hard mask layer to form a pair of control gate stacks elongated in parallel in a first dimension and laterally offset in a second dimension orthogonal to the first dimension, wherein the control gate stacks respectively comprise a first pad and a second pad laterally offset in the first dimension;

depositing a second conductive layer covering the control gate stacks;

recessing a top surface of the second conductive layer until recessed relative to a top surface of the control gate stacks to form a pair of erase gates, including a first erase gate, between which the control gate stacks are arranged, wherein the erase gates have individual sidewalls into which the first and second pads respectively protrude, and wherein the first and second pads are completely between the erase gates in the second dimension; and performing a second etch selectively into the second conductive layer to form a pair of word lines, including a first word line, between and respectively bordering the control gate stacks, wherein the word lines have individual sidewalls into which the first and second pads respectively protrude;

wherein the first word line has a first sidewall and a second sidewall respectively on opposite sides of the first pad and respectively facing and bordering a first pair of sidewalls of the first pad in the first dimension, wherein the first erase gate has a first sidewall and a second sidewall respectively on the opposite sides of the first pad and respectively facing and bordering a second pair of sidewalls of the first pad in the first dimension, and wherein a separation between the first and second sidewalls of the first word line is a same as a separation between the first and second sidewalls of the first erase gate.

16. The method according to claim 15, wherein the second conductive layer has a U-shaped profile between the control gate stacks upon completion of the recessing.

17. The method according to claim 15, wherein the individual sidewalls of the erase gates face each other, and wherein the individual sidewalls of the word lines face away from each other respectively toward the individual sidewalls of the erase gates.

18. The method according to claim 15, further comprising:

forming a contact via overlying and directly contacting each of the first and second pads.

19. The method according to claim 15, wherein the first and second sidewalls of the first word line extend laterally in the second dimension and share a first length in the second dimension, wherein the first and second sidewalls of the first erase gate extend laterally in the second dimension and share a second length in the second dimension that is a same as the first length.

20. The method according to claim 15, wherein the first pair of sidewalls of the first pad extend laterally in the second dimension and share a third length in the second dimension, wherein the second pair of sidewalls of the first pad extend laterally in the second dimension and share a fourth length in the second dimension, and wherein the third and fourth lengths are the same.

* * * * *